United States Patent
Morisue

(10) Patent No.: US 8,937,013 B2
(45) Date of Patent: Jan. 20, 2015

(54) SEMICONDUCTOR DEVICE AND METHOD FOR MANUFACTURING SEMICONDUCTOR

(75) Inventor: Masafumi Morisue, Kawasaki (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 1694 days.

(21) Appl. No.: 11/907,428

(22) Filed: Oct. 12, 2007

(65) Prior Publication Data

US 2008/0087888 A1   Apr. 17, 2008

(30) Foreign Application Priority Data

Oct. 17, 2006  (JP) ................. 2006-282296

(51) Int. Cl.
*H01L 21/44* (2006.01)
*H01L 51/00* (2006.01)
*H01L 51/05* (2006.01)

(52) U.S. Cl.
CPC ........ *H01L 51/0012* (2013.01); *H01L 51/0529* (2013.01); *H01L 51/0005* (2013.01)
USPC ........ 438/658; 438/99; 257/40; 257/E21.476; 257/E51.005

(58) Field of Classification Search
None
See application file for complete search history.

(56) References Cited

U.S. PATENT DOCUMENTS

| | | | |
|---|---|---|---|
| 7,470,604 B2 | 12/2008 | Fujii | |
| 7,615,488 B2 | 11/2009 | Maekawa et al. | |
| 2004/0043334 A1* | 3/2004 | Kobayashi et al. | 430/315 |
| 2005/0170565 A1 | 8/2005 | Fujii et al. | |
| 2005/0221203 A1 | 10/2005 | Fujii | |
| 2006/0087228 A1 | 4/2006 | Kobayashi | |
| 2006/0121745 A1 | 6/2006 | Fujii | |
| 2006/0134918 A1 | 6/2006 | Fujii et al. | |
| 2007/0004202 A1 | 1/2007 | Fujii | |
| 2007/0026580 A1 | 2/2007 | Fujii | |
| 2007/0057258 A1 | 3/2007 | Fukuchi et al. | |
| 2007/0069210 A1 | 3/2007 | Yamazaki et al. | |

(Continued)

FOREIGN PATENT DOCUMENTS

| | | |
|---|---|---|
| JP | 2003-298062 A | 10/2003 |
| JP | 2004-030989 | 1/2004 |

(Continued)

OTHER PUBLICATIONS

Maekawa et al., Pub. Date: Sep. 29, 2005, Pub. No. WO 2005/091375, 133 pages.*

(Continued)

*Primary Examiner* — Marvin Payen
(74) *Attorney, Agent, or Firm* — Eric J. Robinson; Robinson Intellectual Property Law Office, P.C.

(57) ABSTRACT

A method for easily forming a region with conductivity and high wettability without a step for removing a photocatalytic reaction layer, which is formed over a conductive layer, is proposed. The photocatalytic reaction layer is formed over a photocatalytic conductive layer, and the photocatalytic conductive layer is irradiated with ultraviolet light to form a region with conductivity and higher wettability than the photocatalytic reaction layer on a surface of the photocatalytic conductive layer which is irradiated with ultraviolet light. Note that for the photocatalytic conductive layer, a layer having a photocatalytic property of which resistivity is lower than or equal to $1 \times 10^{-2}$ Ω cm can be used.

16 Claims, 11 Drawing Sheets

(56) References Cited

U.S. PATENT DOCUMENTS

| | | |
|---|---|---|
| 2007/0075322 A1 | 4/2007 | Nakamura et al. |
| 2007/0090358 A1 | 4/2007 | Kanno et al. |
| 2007/0131976 A1 | 6/2007 | Kanno et al. |
| 2007/0207571 A1 | 9/2007 | Morisue et al. |
| 2007/0237957 A1* | 10/2007 | Yamashiro et al. ........... 428/403 |

FOREIGN PATENT DOCUMENTS

| | | |
|---|---|---|
| JP | 2004-111480 A | 4/2004 |
| JP | 2005-103339 A | 4/2005 |
| JP | 2005-210014 | 8/2005 |
| JP | 2005-303283 A | 10/2005 |
| JP | 2006-127783 A | 5/2006 |
| JP | 2006-133762 A | 5/2006 |
| JP | 2007-027367 | 2/2007 |
| WO | WO 2005/048221 | 5/2005 |
| WO | WO 2005/091375 | 9/2005 |

OTHER PUBLICATIONS

Yamazaki et al., Pub. Date: May 26, 2005, Pub. No. WO 2005/048221, 99 pages.*

* cited by examiner

SEMICONDUCTOR DEVICE AND METHOD FOR MANUFACTURING SEMICONDUCTOR

BACKGROUND OF THE INVENTION

1. Field of the Invention

The present invention relates to a method for manufacturing a semiconductor device using a droplet discharge method.

2. Description of the Related Art

In recent years, a method using a droplet discharging device for forming thin films and wirings has been proposed to lower costs of facilities and simplify a process, in manufacturing semiconductor devices such as thin film transistors (hereinafter referred to as TFTs), liquid crystal display devices, or EL display devices.

However, a great problem is low accuracy in landing of a liquid material when the liquid material is discharged from a droplet discharging device. In recent years, in order to solve this problem, a technique for forming a lyophilic region (a region with high wettability) and a liquid-repellent region (a region with low wettability) on a surface of the one substrate has been proposed. In particular, a technique for improving surface wettability of a liquid-repellent material utilizing a photocatalytic reaction has attracted attention as an simple and efficient method (for example, Patent Document 1: Japanese Published Patent Application No. 2005-210014). In addition, as a surface modification technique utilizing a photocatalytic reaction, a technique for improving wettability of a photocatalytic substance layer formed of titanium oxide ($TiO_x$) or the like by forming a FAS film thereon and irradiating the photocatalytic substance layer with ultraviolet light to decompose FAS by a photocatalytic reaction, has been proposed.

SUMMARY OF THE INVENTION

However, in the conventional technique, materials for the photocatalytic substance layer need to have a high insulating property. Therefore, there has been a problem that in manufacturing semiconductor devices utilizing wettability of materials of the photocatalytic substance layer formed over a conductive layer, the photocatalytic substance layer formed over the conductive layer needs to be removed, in order to electrically connect the conductive layer under the photocatalytic substance layer to another conductive layer formed over an upper layer in a following step, whereby steps are increased and complicated.

Considering the foregoing problems, in the present invention, a method for easily forming a region with conductivity and high wettability without a step of removing a photocatalytic substance layer formed over a conductive layer is proposed.

One feature of a method of the present invention includes the steps of forming a photocatalytic reaction layer over a photocatalytic conductive layer, irradiating the photocatalytic conductive layer with ultraviolet light to form a region with conductivity and higher wettability than the photocatalytic reaction layer on a surface of the photocatalytic conductive layer irradiated with ultraviolet light. Note that, as the photocatalytic conductive layer, a film having a photocatalytic property of which resistivity is lower than or equal to $1\times10^{-2}$ $\Omega$ cm can be employed. Note that, a layer, which reacts with a photocatalytic conductive layer, when the layer is formed over the photocatalytic conductive layer and at least a surface of the photocatalytic conductive layer is irradiated with ultraviolet light, is called a photocatalytic reaction layer. However, the layer is also called as reaction layer.

One feature of a method for manufacturing a semiconductor device of the present invention includes the steps of forming a photocatalytic conductive layer over a substrate, forming a photocatalytic reaction layer over the photocatalytic conductive layer, and irradiating a surface of the photocatalytic reaction layer with ultraviolet light to form a region with conductivity and higher wettability than the photocatalytic reaction layer on a surface of the photocatalytic conductive layer.

One feature of a method for manufacturing a semiconductor device of the present invention includes the steps of forming a gate electrode over a substrate, forming an insulating layer over the gate electrode, forming a photocatalytic conductive layer over the insulating layer, forming a photocatalytic reaction layer over the photocatalytic conductive layer, irradiating a surface of the photocatalytic reaction layer with ultraviolet light to form a region with conductivity and higher wettability than the photocatalytic reaction layer on a surface of the photocatalytic conductive layer, forming a mask layer by discharging a liquid pattern material into the region with high wettability, forming a first conductive layer and a second conductive layer by etching the photocatalytic conductive layer with the use of the mask layer, and forming an organic semiconductor layer to cover at least a part of the first conductive layer and the second conductive layer.

One feature of a method for manufacturing a semiconductor device includes the steps of forming a photocatalytic conductive layer over a substrate, forming a photocatalytic reaction layer over the photocatalytic conductive layer, irradiating a surface of the photocatalytic reaction layer with ultraviolet light to form a region with conductivity and higher wettability than the photocatalytic reaction layer on a surface of the photocatalytic conductive layer, forming a layer having a light-emitting substance by discharging a liquid light-emitting material into the region with high wettability, and forming a conductive layer over the layer having the light-emitting substance.

One feature of a method for manufacturing a semiconductor device of the present invention includes the steps of forming a photocatalytic conductive layer over a substrate, forming a photocatalytic reaction layer over the photocatalytic conductive layer, irradiating a surface of the photocatalytic reaction layer with ultraviolet light to form a region with conductivity and higher wettability than the photocatalytic reaction layer on a surface of the photocatalytic conductive layer, discharging a liquid composition containing conductive particles into the region with high wettability, baking the discharged composition, and forming a convex conductive layer by repetition of applying and baking the composition.

One feature of a semiconductor device of the present invention includes a photocatalytic conductive layer formed over a substrate, a photocatalytic reaction layer formed over the substrate and on sides of the photocatalytic conductive layer, a layer having a light-emitting substance formed over the photocatalytic conductive layer, and a conductive layer formed over the layer having the light-emitting substance, where a surface of the photocatalytic conductive layer has conductivity and a region with higher wettability than the photocatalytic reaction layer.

One feature of a semiconductor device of the present invention includes a gate electrode formed over a substrate, a first insulating layer formed over the gate electrode, a first conductive layer formed over the first insulating layer, an organic semiconductor layer formed over the first insulating layer and the first conductive layer, a second insulating layer formed over the organic semiconductor layer, a photocatalytic conductive layer formed over the second insulating layer, a photocatalytic reaction layer formed over the second insulating layer and on sides of the photocatalytic conductive layer, a layer having a light-emitting substance formed over the photocatalytic conductive layer, and a second conductive layer formed over the layer having the light-emitting substance, where a surface of the photocatalytic conductive layer has conductivity and a region with higher wettability than the photocatalytic reaction layer.

One feature of a semiconductor device of the present invention includes a gate electrode formed over a substrate, a first insulating layer formed over the gate electrode, a first photocatalytic conductive layer formed over the first insulating layer, an organic semiconductor layer formed over the first insulating layer and the first photocatalytic conductive layer, a second insulating layer formed over the organic semiconductor layer, a second photocatalytic conductive layer formed over the second insulating layer, a photocatalytic reaction layer formed over the second insulating layer and on sides of the second photocatalytic conductive layer, a layer having a light-emitting substance formed over the second photocatalytic conductive layer, and a conductive layer formed over the layer having the light-emitting substance, where the first photocatalytic conductive layer and a surface of the second photocatalytic conductive layer have conductivity and regions with higher wettability than the photocatalytic reaction layer.

In a semiconductor device or a method for manufacturing the semiconductor device of the present invention, the photocatalytic conductive layer is a layer having a photocatalytic property of which resistivity is lower than or equal to $1 \times 10^{-2}$ $\Omega$ cm. Moreover, as the photocatalytic conductive layer, any of the following can be used: a film containing indium tin oxide, a film including a conductive material which contains indium tin oxide mixed with silicon oxide, a fluorine-doped tin oxide film, an antimony-doped tin oxide film, an tin oxide film, a fluorine-doped zinc oxide film, an aluminum-doped zinc oxide film, a gallium-doped zinc oxide film, a boron-doped zinc oxide film, and a zinc oxide film.

In a semiconductor device or a method for manufacturing the semiconductor device of the present invention, the photocatalytic reaction layer can be formed using a composition containing compounds having an alkyl group or a composition having organic silane.

According to the present invention, using a simple method of irradiating a photocatalytic conductive layer with ultraviolet light to decompose or alter a photocatalytic reaction layer formed over the photocatalytic conductive layer using a photocatalytic reaction, a region with conductivity and higher wettability than the photocatalytic reaction layer on a surface of the photocatalytic conductive layer. Accordingly, without complicated steps, regions having different wettability can be formed on the photocatalytic conductive layer. Therefore, adhesion between the photocatalytic conductive layer in a region with high wettability and a conductive material formed over the region with high wettability can be improved, so that semiconductor devices with high reliability can be easily manufactured.

DETAILED DESCRIPTION OF THE INVENTION

Figure 1A:
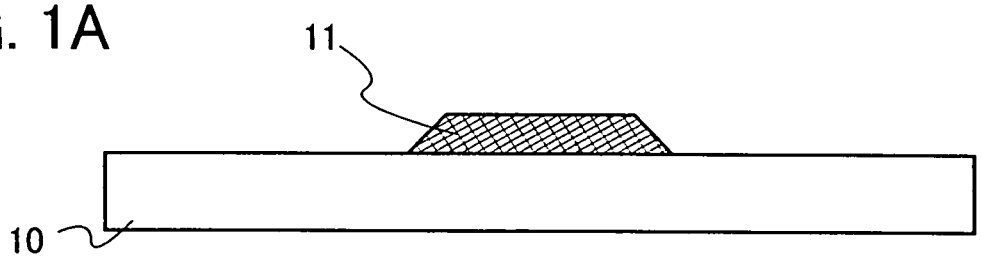
FIGS. 1A to 1D illustrate steps for manufacturing an organic transistor using a photocatalytic conductive layer and a photocatalytic reaction layer.

Embodiment modes and an embodiment of the present invention will be described with reference to the drawings. It is easily understood by those skilled in the art that the present invention can be carried out with various changes and modifications without departing from the spirit and the scope of the present invention. Accordingly, the present invention and the embodiment should not be construed as being limited to the embodiment modes described below. Note that in structures of the present invention described below, common portions or portions having similar functions are denoted by the same reference numerals in the drawings, and repetitive description thereof is omitted.

(Embodiment Mode 1)

In this embodiment mode, an example of steps for manufacturing an organic transistor using a droplet discharge method will be described with reference to drawings. Note that a droplet discharge method is a method in which a prepared composition is ejected from a nozzle, in accordance with an electrical signal, to obtain a small amount of droplet and then attach it to a predetermined position. A droplet discharge method is also called an ink-jet method.

First, a gate electrode 11 is formed over a substrate 10 (FIG. 1A). As materials for the substrate, any of the following may be employed: insulating substrates such as a glass substrate, a quartz substrate, and crystalline glass, a ceramic substrate, a stainless steel substrate, a metal substrate (tantalum, tungsten, molybdenum, and the like), a semiconductor substrate, a plastic substrate (polyimide, acrylic, polyethylene terephthalate, polycarbonate, polyarylate, polyethersulfone, and the like), films, and the like. In particular, a heat-resistant material that at least endures heat generated in a process is employed. In this embodiment mode, a glass substrate is used.

The gate electrode 11 may be formed by processing a film of a conductive material into a desired shape by a photolithography method. Alternatively, droplets including a conductive material may be obtained by a droplet discharge method or the like. It is to be noted that a method for manufacturing the gate electrode 11 in the present invention is not limited to this. A structure of the gate electrode may be a single layer structure or a multilayer structure in which two or more layers of conductive materials are stacked. In multilayer structure, conductive materials may be appropriately selected.

Figure 1B:
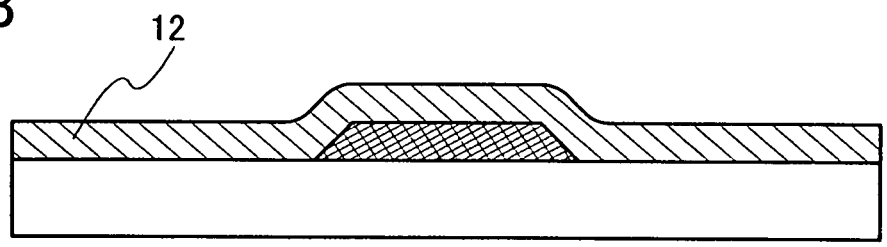

Next, an insulating layer 12 covering the gate electrode 11 is formed (FIG. 1B). The insulating layer 12 can be formed using an insulating film containing silicon. For example, an inorganic insulating material such as silicon oxide, silicon nitride, silicon oxide containing nitrogen, or silicon nitride containing oxygen may be used. Besides, the insulating layer 12 may be formed using an organic insulating material such as acrylic or polyimide, or a so-called siloxane based material having a skeleton structure formed by a bond of silicon and oxygen, in which as a substituent, an organic group containing at least hydrogen (for example, an alkyl group or aromatic hydrocarbon), a fluoro group, or an organic group containing at least hydrogen and a fluoro group is included. The insulating film of the present invention is not limited to these materials. Note that the insulating layer 12 may be a single layer or a multilayer of two or more layers. Moreover, this embodiment mode includes a step of inducing a photocatalytic reaction of a photocatalytic conductive layer by irradiating the photocatalytic conductive layer, which is formed on the insulating layer 12 in a following step, with ultraviolet light with the use of the gate electrode 11 as a mask. Accordingly, as a material for the insulating layer 12 in this embodiment mode, there is no particular limitation if the material does not completely shield light with a wavelength which induces a photocatalytic reaction of the photocatalytic conductive layer.

The insulating layer 12 may be formed by a coating method such as a dipping method, a spin coating method, a droplet discharge method, a cast method, a spinner method, and a printing method; a CVD method; a sputtering method. In addition, the insulating layer 12 may be formed by oxidizing a surface of the gate electrode by an anodic oxidation method. When a coating method using an organic insulating material or a siloxane based material is employed to form the insulating layer 12, concavity and convexity of a bottom layer can be reduced and high wettability and favorable alignment of an organic semiconductor layer 16 to be formed over the insulating layer 12 can be achieved.

Figure 1C:
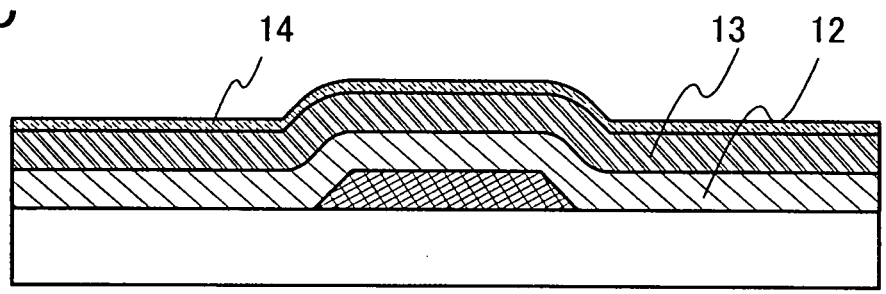

Next, a photocatalytic conductive layer 13 is formed over the insulating layer 12 (FIG 1C). It is to be noted that a photocatalytic conductive layer is a conductive layer having a photocatalytic property, which shows a photocatalytic reaction by irradiation with ultraviolet rays, thereby decomposing or altering a photocatalytic reaction layer formed on the photocatalytic conductive layer. In this embodiment mode, for the photocatalytic conductive layer 13, a film having a photocatalytic property of which resistivity is lower than or equal to $1 \times 10^{-2}$ Ω cm can be employed. As the photocatalytic conductive layer, a conductive film containing an indium tin oxide (ITO) based, indium oxide (SnO) based, or zinc oxide (ZnO) based material can be used. Specifically, a film containing indium tin oxide, a film including conductive material containing ITO mixed with silicon oxide, a fluorine-doped tin oxide film, an antimony-doped tin oxide film, a tin oxide film, a fluorine-doped zinc oxide film, an aluminum-doped zinc oxide film, a gallium-doped zinc oxide film, a boron-doped zinc oxide film, a zinc oxide film, or the like can be used. Note that an ITO based conductive film has high conductivity and easy is to be processed, thus a highly reliable semiconductor device can be manufactured more easily with the use of the ITO based conductive film. These materials can be formed over the insulating layer 12 by a sputtering method.

Subsequently, a photocatalytic reaction layer (also called a layer with low wettability) 14 is formed over the photocatalytic conductive layer 13 (FIG. 1C). On the photocatalytic reaction layer 14, a region with low wettability is formed relative to a pattern material formed later. The photocatalytic reaction layer 14 can be formed using a composition including a compound containing an alkyl group or a fluorocarbon chain.

As an example of a composition of the photocatalytic reaction layer 14, organic silane represented by a chemical formula: $R_n—Si—X_{(4-n)}$ (n=1, 2, 3) is given. In this formula, R denotes a substrate including a group that is comparatively inactive such as a fluoro alkyl group or an alkyl group, and X denotes a hydrolytic group that can be coupled to a hydroxyl group on a surface of a base or adsorption water. As representative examples of X, halogen, a methoxy group, an ethoxy group, and an acetoxy group are given.

As an example of organic silane, alkoxysilane having an alkyl group as R may be used. For alkoxysilane, alkoxysilane having 2 to 30 carbon atoms is preferably used. Typically given are ethyltriethoxysilane, propyltriethoxysilane, octyltriethoxysilane, decyltriethoxysilane, octadecyltriethoxysilane (ODS), eicosyltriethoxysilane, and triacontyltriethoxysilane. In particular, a silane compound having a long chain alkyl group can further lower wettability, and thus it is preferably used.

As another example of organic silane, fluoroalkylsilane (hereinafter referred to as FAS) having a fluoroalkyl group as R may be used. FAS is preferably used because wettability can be further lowered. R of FAS has a structure represented by $(CF_3)(CF_2)_x(CH_2)_y$, where x is an integer in the range of 0 to 10 and y is an integer in the range of 0 to 4. When a plurality of R or X is coupled to Si, all of the R or X may be the same or different. As typical examples of fluoroalkylsilane (FAS) are given as follow:
heptadecafluorotetrahydrodecyltriethoxysilane,
heptadecafluorotetrahydrodecyltrichlorosilane,
tridecafluorotetrahydrooctyltrichlorosilane, and trifluoropropyltrimethoxysilane and the like.

When the photocatalytic reaction layer 14 is formed using any of the aforementioned materials, the photocatalytic reaction layer 14 may be formed by chemically adsorbing any of the aforementioned materials onto a surface of the photocatalytic conductive layer 13 by a vapor deposition method. The chemical adsorption allows a monomolecular layer to be formed. Alternatively, the photocatalytic reaction layer 14 may be formed using any of the aforementioned materials by a droplet discharge method, a coating method, or the like.

When the photocatalytic reaction layer 14 is formed of the monomolecular layer, a part of the photocatalytic reaction layer can be immediately decomposed later. In addition, because of a uniform thickness of the monomolecular layer, the photocatalytic reaction layer can be decomposed without variations. In order to obtain the monomolecular layer, a substrate is placed in an airtight container containing organic silane to chemically adsorb organic silane onto a surface of an insulating layer. Then, the monomolecular layer is obtained by washing with alcohol, and the photocatalytic reaction layer can be formed. As an alternative, a substrate may be soaked in a solution containing organic silane, so that organic silane is chemically adsorbed onto the surface of an insulating film to be a monomolecular film used for the photocatalytic reaction layer.

Figure 1D:
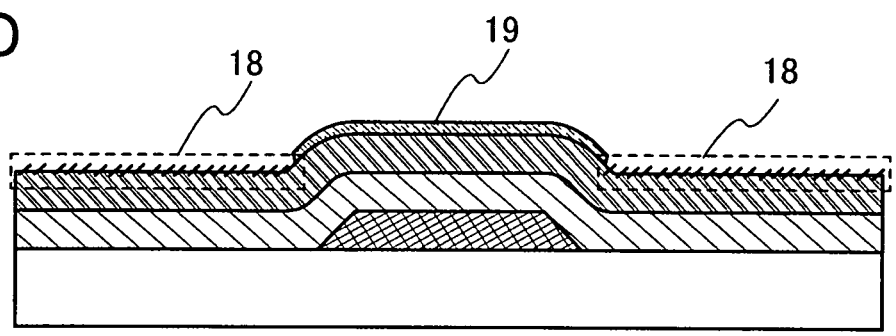
Figure 1D:
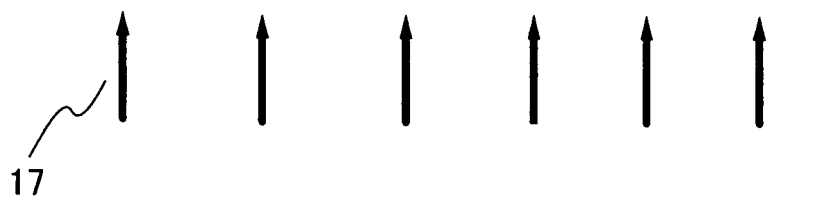

Next, the photocatalytic reaction layer 14 is irradiated with ultraviolet light 17 from the substrate 10 side using the gate electrode 11 as a mask (FIG 1D). Irradiation with ultraviolet light permits the photocatalytic conductive layer 13 to absorb light to be activated. Accordingly, a bond of a substance of the photocatalytic reaction layer 14 is dissociated to form a region with high wettability 18 over the photocatalytic conductive layer 13 (FIG. 1D). Here, a surface of the photocatalytic conductive layer 13 has conductivity in the region with high wettability 18. In addition, a region with low wettability is left in a region which is not irradiated with the ultraviolet light 17. Here, the left region with low wettability is referred to as a layer with low wettability 19. Note that, in this embodiment mode, irradiation with ultraviolet light is performed from the substrate 10 side, but the present invention is not necessarily limited to this. Irradiation with ultraviolet light may be carried out from the photocatalytic reaction layer 14 side. In such a case, light may be shielded with a separately prepared photo mask or light irradiation may be selectively performed using a laser direct writing system without a mask.

It is to be noted that light with a wavelength of approximately 350 nm or less can be employed as ultraviolet light. Preferably used is light with a wavelength of approximately 250 nm to 350 nm. Using light with a wavelength of approximately 250 nm to 350 nm can prevent oxygen or water in the air from absorbing light; therefore, this process can be performed not only in the vacuum but also in the air.

Figure 2A:
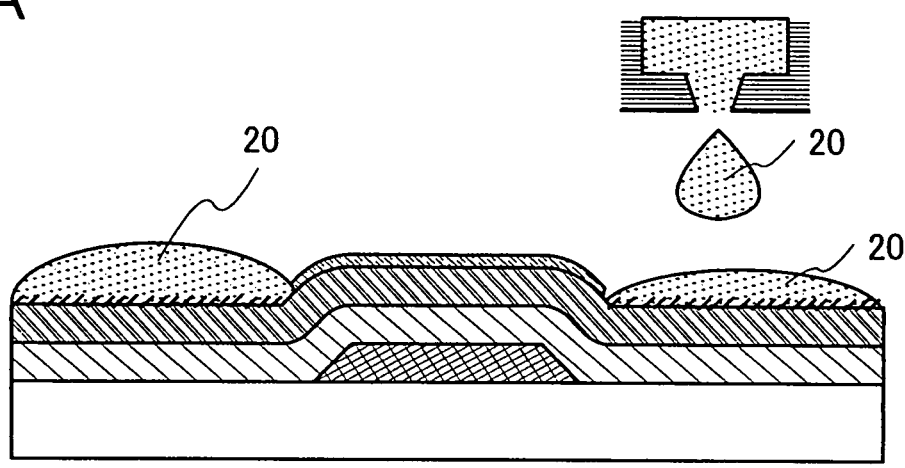
FIGS. 2A to 2C illustrate steps for manufacturing an organic transistor using a photocatalytic conductive layer and a photocatalytic reaction layer.

Then, pattern materials 20 are applied to the conductive layer to form a mask layer using a droplet discharging device (FIG. 2A). For the pattern materials, any of the following can be used: a water-soluble resin such as PVA (polyvinyl alcohol); a photosensitive or non-photosensitive organic material such as polyimide, novolac, acrylic, polyamide or benzocyclobutene; or an organic resin such as siloxane. These materials can be selectively formed in a region with high wettability of the conductive layer by a droplet discharge method. Moreover, the material can be selectively formed only in the region with high wettability, thus it is possible to save the pattern material.

Figure 2B:
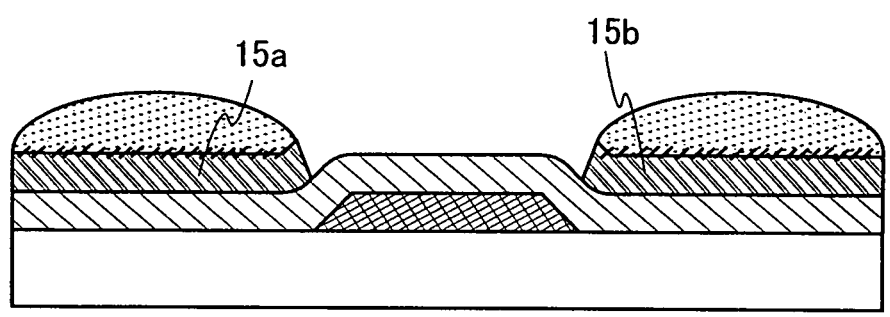

After that, a part of the photocatalytic conductive layer 13 is etched using the pattern materials 20 as masks in order to form conductive layers 15a and 15b, which functions as source and drain electrodes(FIG 2B).

Figure 2C:
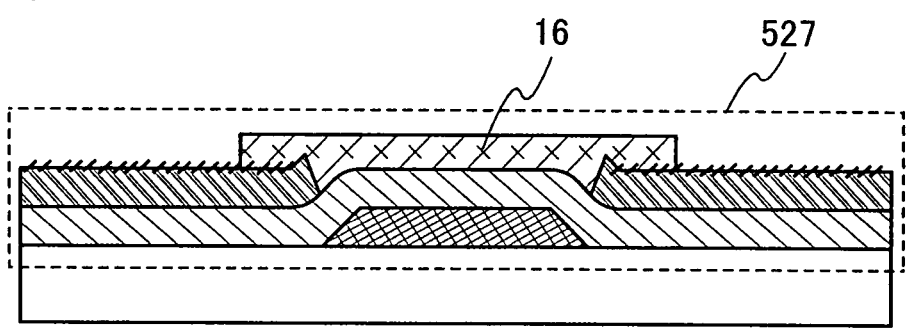

Next, the pattern materials 20 over the conductive layers 15a and 15b are removed, and then an organic semiconductor layer 16 is formed over the conductive layers 15a and 15b, and the insulating layer 12 (FIG 2C). An evaporation method, a spin coating method, a droplet discharge method, or the like can be used for forming the organic semiconductor layer over the conductive layers 15a and 15b, and the insulating layer 12. Note that, in this embodiment mode, a region with high wettability of a surface of the photocatalytic reaction layer has conductivity; therefore, merely forming the organic semiconductor film over the region with high wettability of the photocatalytic conductive layer makes it possible to secure conduction between the photocatalytic conductive layer and the organic semiconductor film. That is, the high wettability conductive layers 15a and 15b, which function as source and drain electrodes in a self-aligned manner, can be formed when the pattern material 20 is removed.

An organic semiconductor material for forming the organic semiconductor layer 16 may be either a low-molecular or high-molecular organic material as long as it is an organic semiconductor material which has a carrier transporting property and in which carrier density is possibly modulated by an electric field effect. There is no particular limitation on kinds thereof. Examples are a polycyclic aromatic compound, a conjugated double bond compound, a metal phthalocyanine complex, a charge-transfer complex, condensed ring tetracarboxylic acid diimides, oligothiophenes, fullerenes, carbon nanotube, and the like. It is possible to use, for example, polypyrrole, polythiophene, poly(3-alkylthiophene), polythienylenevinylene, poly(p-phenylenevinylene), polyaniline, polydiacetylene, polyazulene, polypyrene, polycarbazole, polyselenophene, polyfuran, poly(p-phenylene), polyindole, polypyridazine, naphthacene, hexacene, heptacene, pyrene, chrysene, perylene, coronene, terrylene, ovalene, quaterrylene, anthracene, triphenodioxazine, triphenodithiazine, hexacene-6,15-quinone, polyvinylcarbazole, polyphenylenesulfide, polyvinylenesulfide, polyvinylpyridine, naphthalenetetracarboxylic acid diimide, anthracenetetracarboxylic acid diimide, C60, C70, C76, C78, C84, or a derivative thereof. In addition, specific examples thereof are tetracene, pentacene, sexithiophene (6T), copper phthalocyanine, bis-(1,2,5-thiadiazolo)-p-quinobis(1,3-dithiole), rubrene, poly(2,5-thienylene vinylene) (PTV), poly (3-hexylthiophene) (P3HT), and dioctylfluorene-bithiophene copolymer (F8T2), which are generally referred to as p-type semiconductors; 7,7,8,8-tetracyanoquinodimethane (TCNQ), 3,4,9,10-perylenetetracarboxylic dianhydride (PTCDA), 1,4,5,8-naphthalenetetracarboxylic dianhydride (NTCDA), 9,9,10,10-tetracyano-2,6-naphthoquinodimethane (TCNNQ), N,N'-dioctyl-3,4,9,10-perylenetetracarboxylic diimide (PTCDI-C8H), copper hexadecafluorophthalocyanine ($F_{16}CuPc$), and 3',4'-dibutyl-5,5"-bis (dicyanomethylene)-5,5"-dihydro-2,2':5',2"-terthiophene) (DCMT), which are generally referred to as n-type semiconductors; and the like. Note that characteristics of a p-type or n-type organic semiconductor are not peculiar to the substance but depend on the relationship with an electrode into which carriers are injected or the intensity of an electric field at the time of the injection. The semiconductor material can be used as either a p-type or n-type semiconductor, while it has a tendency to easily become one of them.

Through the aforementioned steps, an organic transistor 527 can be completed.

Figure 3:
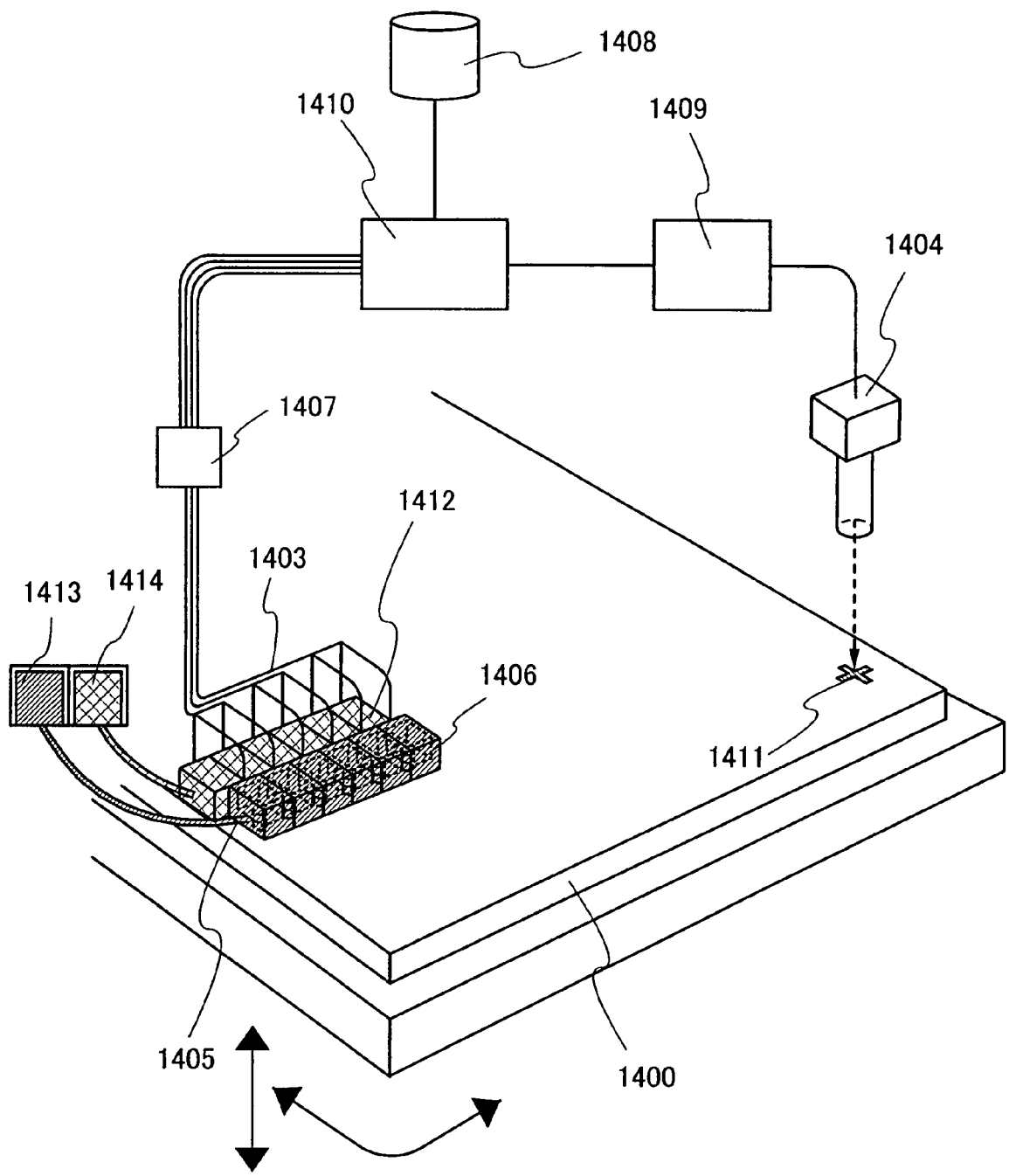
FIG. 3 illustrates an example of a droplet discharging device.

One aspect of a droplet discharging device used for a droplet discharge method is shown in FIG. 3. Each of heads 1405 and 1412 of a droplet discharging means 1403 is connected to a control means 1407, and this control means 1407 is controlled by a computer 1410, so that a preprogrammed pattern can be drawn. The drawing position may be determined, for example, with reference to a marker 1411 that is formed over a substrate 1400. Alternatively, a reference point may be fixed with reference to an edge of the substrate 1400. The reference point is detected by an imaging unit 1404 and changed into a digital signal by an image processing unit 1409. Then, the digital signal is recognized by the computer 1410 to generate a control signal, and the control signal is transmitted to the control means 1407. An image sensor or the like using a charge coupled device (CCD) or a complementary metal oxide semiconductor can be used as the imaging unit 1404. Naturally, information on a pattern to be formed over the substrate 1400 is stored in a storage medium 1408, and the control signal is transmitted to the control means 1407 based on the information, so that each of the heads 1405 and 1412 of the droplet discharging means 1403 can be individually controlled. Materials to be discharged from material supply sources 1413 and 1414 are supplied to the heads 1405 and 1412 through pipes, respectively.

An inside of the head 1405 has a space filled with a liquid material as shown by dotted lines 1406 and a nozzle which is a discharge opening. Although not shown, an inside structure of the head 1412 is similar to that of the head 1405. When the nozzle sizes of the heads 1405 and 1412 are different from each other, different materials with different widths can be discharged simultaneously. A conductive material, an organic material, an inorganic material, or the like can be each discharged from one head. In the case of a wide area such as an interlayer film, the same material can be simultaneously discharged from a plurality of nozzles to improve throughput. In this way, drawing can be performed. When a large substrate is used, the heads 1405 and 1412 can freely scan over the substrate in a direction indicated by the arrows, and a region where drawing is performed can be freely set. Thus, a plurality of the same patterns can be drawn on one substrate.

In forming a conductive layer by a droplet discharge method, a composition containing particles of a conductive material is discharged, and fused or welded by baking to solidify the composition. A conductive layer (or an insulating film) formed by discharging and baking the composition containing a conductive material is, in many cases, in a polycrystalline state with many grain boundaries whereas a conductive layer (or an insulating film) formed by a sputtering method or the like has, in many cases, a columnar structure.

In this embodiment mode, using a simple method of irradiating a photocatalytic reaction layer formed over a photocatalytic conductive layer with ultraviolet light, a region with conductivity and high wettability can be formed on a surface of the photocatalytic conductive layer. Since materials for a conventional photocatalytic substance layer need to have a high insulating property, in connecting a first conductive layer under the photocatalytic substance layer to a second conductive layer formed over the photocatalytic substance layer in a following step, the photocatalytic substance layer having an insulating property formed over the first conductive layer needs to be removed, whereby steps of process have been increased and complicated. However, by utilizing a method described in this embodiment mode, a region with conductivity and high wettability can be formed on the surface of the photocatalytic conductive layer, and a source electrode or a drain electrode can be formed in a self-aligned manner, without a complicated process. Further, since the region with high wettability can be formed on the source electrode or the drain electrode, adhesion of the source electrode or the drain electrode and an organic semiconductor layer formed thereover can be improved. Accordingly, a highly reliable organic transistor can be easily manufactured.

A method for manufacturing a semiconductor device of the present invention is not limited to the method for manufacturing an organic transistor described in this embodiment mode. The method for manufacturing a semiconductor device of the invention can be employed for manufacture of various semiconductor devices including the steps of forming a photocatalytic reaction layer over a photocatalytic conductive layer, irradiating the photocatalytic reaction layer with ultraviolet light, so that a region with conductivity and higher wettability than the photocatalytic reaction layer is formed on the surface of the photocatalytic conductive layer in a region irradiated with ultraviolet light.

(Embodiment Mode 2)

In this embodiment mode, an example of a method for manufacturing a light-emitting element with the use of electro luminescence (EL) by a droplet discharge method will be described with reference to the drawings.

The light-emitting element is an element formed in such a way that a light-emitting layer containing an organic compound or an inorganic compound having different carrier transporting properties is stacked between a pair of electrodes, so that holes can be injected from an electrode and electrons can be injected from the other electrode. The light-emitting element utilizes a phenomenon in which holes and electrons are recombined to excite luminescent center and light is emitted when the excited state returns to a ground state. The injection characteristics of the holes and the electrons into the light-emitting layer depend on the level of work function of a material forming an electrode (minimum energy required to extract one electron from the surface of metal or semiconductors to immediately outside thereof). Preferably used materials for the electrode into which holes are injected have a high work function, and materials for the electrode into which electrons are injected preferably have a low work function. When an organic compound material is used at least for a light-emitting layer, an element is called an organic EL element. When an inorganic compound material is used at least for a light-emitting layer, an element is called an inorganic EL element. Further, in employing both an organic compound material and an inorganic compound material for the light-emitting elements, an element is called a hybrid EL element or the like.

A method for manufacturing the light-emitting element in this embodiment mode will be described with reference to the drawings.

Figure 4A:
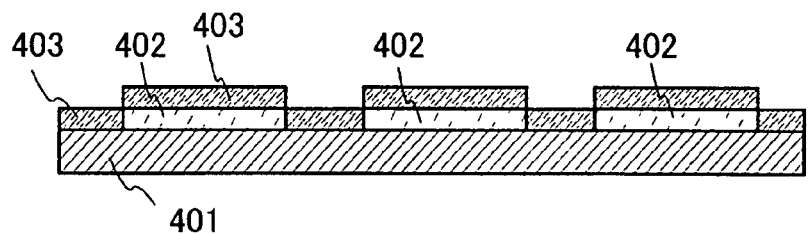
FIGS. 4A to 4D illustrate steps for manufacturing a light-emitting element using a photocatalytic conductive layer and a photocatalytic reaction layer.

First, as shown in FIG. 4A, photocatalytic conductive layers 402 which serve as pixel electrodes are formed over a substrate 401. Note that, for the photocatalytic conductive layers 402 serving as the pixel electrodes, a photocatalytic conductive layer similar to the photocatalytic conductive layer 13 shown in Embodiment Mode 1 can be used.

Subsequently, photocatalytic reaction layers 403 are formed over the photocatalytic conductive layers 402 (FIG. 4A). The photocatalytic reaction layers 403 can be manufactured in a similar manner to the photocatalytic reaction layer 14 described in Embodiment Mode 1.

Figure 4B:
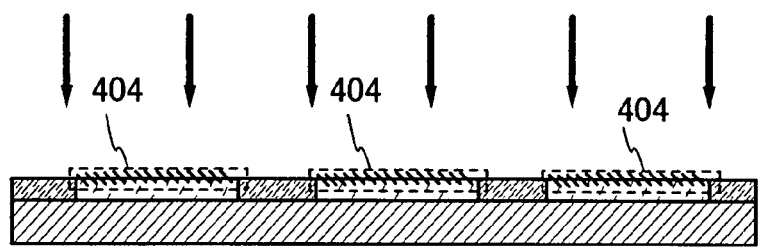

Next, the photocatalytic reaction layers 403 are irradiate with ultraviolet light (FIG. 4B). Irradiation with ultraviolet light causes reaction between the photocatalytic reaction layers 403 and the photocatalytic conductive layers 402, thus the photocatalytic reaction layers 403 are decomposed or altered on the surface of the photocatalytic conductive layers 402 to form regions 404 with conductivity and high wettability on portions irradiated with ultraviolet light. Wettability of the photocatalytic reaction layers 403 in regions which are not in contact with the photocatalytic conductive layers 402, is not altered, namely, they are left as low wettability. Note that regions whose wettability is not altered and which are left on the substrate 401 and the sides of the photocatalytic conductive layers 402 may be removed by etching or left as they are.

Figure 4C:
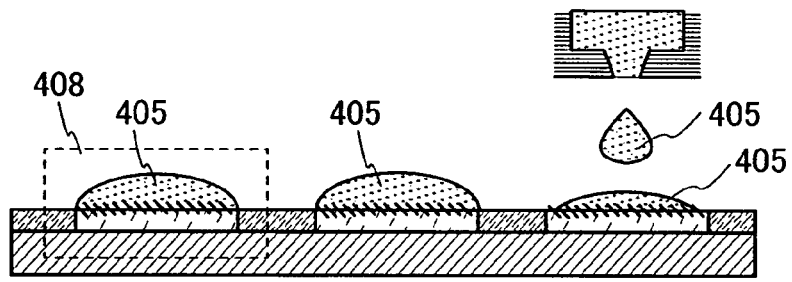

Layers 405 containing a light-emitting substance are formed over the photocatalytic conductive layers 402 using the droplet discharging device (FIG. 4C). In such a manner, the layers containing the light-emitting substance can be effectively formed only in the regions with high wettability on the surface of the photocatalytic conductive layers. It makes possible to form the layers containing the light-emitting substance only over the photocatalytic conductive layers serving as the pixel electrodes even when insulators to be banks are not formed around the pixel electrodes, so that the light-emitting layers are not formed over other portions except the photocatalytic conductive layers serving as the pixel electrodes. Formation of the layers containing the light-emitting substance is permitted only in a desired position, thereby saving the material. Moreover, the photocatalytic conductive layers have conductivity and high wettability. Consequently, a highly reliable light-emitting element whose adhesion between the pixel electrodes and the layers containing the light-emitting substance is improved can be manufactured.

Figure 4D:
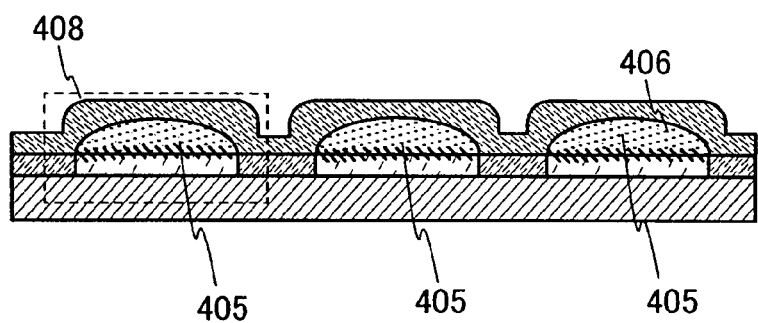

After that, a conductive layer 406, which functions as a counter electrode is formed over layers containing a light-emitting substance 405 (FIG. 4D). Then, a protective film is preferably formed over the conductive layer 406. Note that in this embodiment mode the photocatalytic reaction layers 403 are left over the substrate 401 and the sides of the photocatalytic conductive layers 402. As a result, steps formed by the photocatalytic conductive layers 402 and the substrate 401 can be relieved and disconnection of the conductive layer 406 formed over the layers containing the light-emitting substance 405 can be avoided.

Through the above steps, the photocatalytic conductive layers 402, the layers containing the light-emitting substance 405, and a light-emitting element 408 having the conductive layer 406 can be formed.

In this embodiment mode, using a simple method of irradiating photocatalytic reaction layers formed over photocatalytic conductive layers with ultraviolet light, a region with conductivity and higher wettability than the photocatalytic reaction layer can be accurately formed on a surface of the photocatalytic conductive layers. Accordingly, without a complicated process, a light-emitting material can be accurately formed on a surface of photocatalytic conductive layers, which serves as pixel electrodes by a droplet discharging device. Further, a highly reliable light-emitting element of which adhesion between the photocatalytic conductive layers serving as the pixel electrodes and the layers containing the light-emitting substance is improved can be easily manufactured. Therefore, according to this embodiment mode, a light-emitting element having high luminance efficiency and high reliability can be easily manufactured with a high yield.

An element structure using an organic compound or an inorganic compound for the layers containing the light-emitting substance of a light-emitting element will be described.

First, an organic EL element using an organic compound for the layers containing the light-emitting substance will be described.

As the organic compound having a light-emitting property, for example, the following are given: 9,10-di(2-naphthyl)anthracene (abbreviation: DNA); 2-tert-butyl-9,10-di(2-naphthyl)anthracene (abbreviation: t-BuDNA); 4,4'-bis (2,2-diphenylvinyl)biphenyl (abbreviation: DPVBi); coumarin 30; coumarin 6; coumarin 545; coumarin 545T; perylene; rubrene; periflanthene; 2,5,8,11-tetra(tert-butyl)perylene (abbreviation: TBP); 9,10-diphenylanthracene (abbreviation: DPA); 5,12-diphenyltetracene; 4-(dicyanomethylene)-2-methyl-6-[p-(dimethylamino)styryl]-4H-pyran (abbreviation: DCM1); 4-(dicyanomethylene)-2-methyl-6-[2-(julolidin-9-yl)ethenyl]-4H-pyran (abbreviation: DCM2); 4-(dicyanomethylene)-2,6-bis[p-(dimethylamino)styryl]-4H-pyran (abbreviation: BisDCM); and the like. Moreover, compounds capable of emitting phosphorescence such as the following can be given: bis[2-(4',6'-difluorophenyl)pyridinato-N,$C^2$](picolinato)iridium (abbreviation: Flrpic); bis{2-[3',5'-bis(trifluoromethyl)phenyl]pydinato-N,$C^2$}(picolinato)iridium (abbreviation: Ir($CF_3$ppy)$_2$(Pic)); tris(2-phenylpyridinato-N,$C^2$)iridium (abbreviation: Ir(ppy)$_3$); (acetylacetonato)bis(2-phenylpyridinato-N,$C^2$)iridium (abbreviation: Ir(ppy)$_2$(acac)); (acetylacetonato)bis[2-(2'-thienyl)pyridinato-N,$C^3$]iridium (abbreviation: Ir(thp)$_2$(acac)); (acetylacetonato)bis(2-phenylquinolinato-N,$C^2$)iridium (abbreviation: Ir(pq)$_2$(acac)); (acetylacetonato)bis[2-(2'-benzothienyl)pyridinato-N,$C^3$]iridium (abbreviation: Ir(btp)$_2$(acac)), and the like.

Figure 5A:
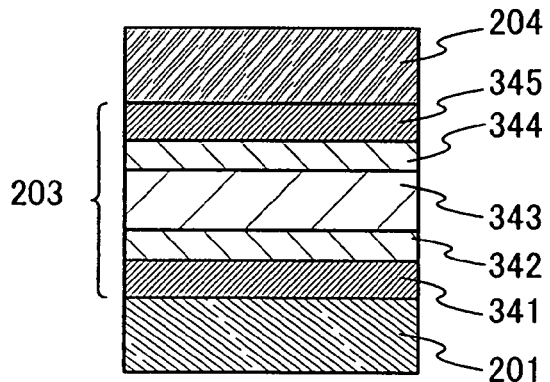
FIGS. 5A to 5E illustrate structures of light-emitting elements.

As shown in FIG. 5A, the light-emitting element may have a structure in which layer 203 containing a light-emitting substance and a second conductive layer 204 are formed over a first conductive layer 201. The layer 203 containing the light-emitting substance is formed of the following: a hole-injecting layer 341 formed of a material with a hole-injecting property, a hole-transporting layer 342 formed of a material with a hole-transporting property, a light-emitting layer 343 formed of an organic compound with a light-emitting property, an electron-transporting layer 344 formed of a material with an electron-transporting property, and an electron-injecting layer 345 formed of a material with an electron-injecting property.

As the material with a hole-transporting property, phthalocyanine (abbreviation: $H_2Pc$); copper phthalocyanine (abbreviation: CuPc); vanadyl phthalocyanine (abbreviation: VOPc); 4,4',4"-tris(N,N-diphenylamino)triphenylamine (abbreviation: TDATA); 4,4',4"-tris[N-(3-methylphenyl)-N-phenylamino]triphenylamine (abbreviation: MTDATA); 1,3,5-tris[NN-di(m-tolyl)amino]benzene (abbreviation: m-MTDAB); N,N'-diphenyl-N,N'-bis (3-methylphenyl)-1,1'-biphenyl-4,4'-diamine (abbreviation: TPD); 4,4'-bis[N-(1-naphthyl)-N-phenylamino]biphenyl (abbreviation: NPB); 4,4'-bis{N-[4-di(m-tolyl)amino]phenyl-N-phenylamino}biphenyl (abbreviation: DNTPD); 4,4'-bis[N-(4-biphenylyl)-N-phenylamino]biphenyl (abbreviation: BBPB); 4,4',4"-tri(N-carbazolyl)triphenylamine (abbreviation: TCTA); and the like may be used. Note that the material is not limited to these. Among the above compounds, an aromatic amine compound typified by TDATA, MTDATA, m-MTDAB, TPD, NPB, DNTPD, BBPB, TCYA, NPB, or the like is a preferable compound group as the organic compound because it easily generates holes. The substances mentioned here generally have a hole mobility of $10^{-6}$ cm$^2$/Vs or more.

As a material with a hole-injecting property, besides the aforementioned materials with a hole-transporting property, a chemically doped conductive high molecular compound can also be used. For example, polyaniline (abbreviation: PAni); polyethylene dioxythiophene (abbreviation: PEDOT) doped with polystyrene sulfonate (abbreviation: PSS); or the like can also be used. Further, a thin film of an inorganic semiconductor such as molybdenum oxide, vanadium oxide, or nickel oxide (NiO$_x$), or an ultrathin film of an inorganic insulator such as aluminum oxide (Al$_2$O$_3$) is also effective.

Here, a material with an electron-transporting property may be a material including a metal complex with a quinoline skeleton or a benzoquinoline skeleton, or the like. For example as follow: tris(8-quinolinolato)aluminum (abbreviation: Alq$_3$), tris(4-methyl-8-quinolinolato)aluminum (abbreviation: Almq$_3$), bis(10-hydroxybenzo[h]-quinolinato)beryllium (abbreviation: BeBq$_2$), bis(2-methyl-8-quinolinolato)-4-phenylphenolato-aluminum (abbreviation: BAlq), or the like. Further, a metal complex having an oxazole based ligand or a thiazole based ligand, or the like can also be used, such as bis[2-(2-hydroxyphenyl)benzoxazolato]zinc (abbreviation: Zn(BOX)$_2$), or bis[2-(2-hydroxyphenyl)benzothiazolato] zinc (abbreviation: Zn(BTZ)$_2$). Besides a metal complex, 2-(4-biphenylyl)-5-(4-tert-butylphenyl)-1,3,4-oxadiazole (abbreviation: PBD), 1,3-bis[5-(p-tert-butylphenyl)-1,3,4-oxadiazole-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproin (abbreviation: BCP), or the like can be used. The substances mentioned here generally have an electron mobility of $10^{-6}$ cm$^2$/Vs or more.

As a material with an electron-injecting property, besides the aforementioned materials with an electron-transporting property, an ultrathin film of an insulator is often used. For example, as follow: a halide of an alkali metal, such as LiF or CsF; a halide of an alkaline-earth, such as CaF$_2$; or an alkali metal oxide, such as Li$_2$O. Further, an alkali metal complex such as lithium acetyl acetonate (abbreviation: Li(acac)) or 8-quinolinolato-lithium (abbreviation: Liq) is also effective. Furthermore, a material mixed with the aforementioned material with an electron-transporting property and a metal with a low work function such as Mg, Li, or Cs can be used.

Figure 5B:
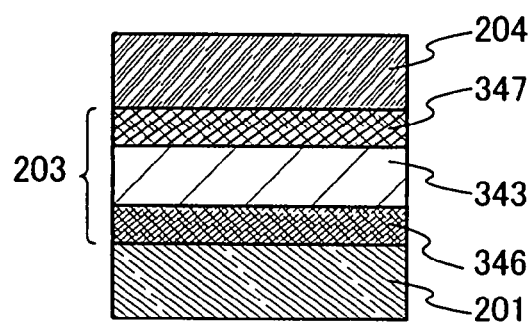

As shown in FIG. 5B, the light-emitting element may be formed of the first conductive layer 201, the layer 203 containing the light-emitting substance, and the second conductive layer 204. The layer 203 containing the light-emitting substance includes a hole-transporting layer 346 formed of an organic compound and an inorganic compound having an electron-accepting property with respect to the organic compound, the light-emitting layer 343 formed of an organic compound with a light-emitting property, and an electron-transporting layer 347 formed of an inorganic compound having an electron-donating property with respect to the organic compound with a light-emitting property.

As the organic compound for the hole-transporting layer 346 formed of the organic compound with a light-emitting property and the inorganic compound having an electron-accepting property with respect to the organic compound with a light-emitting property, the aforementioned organic compound with a hole-transporting property may be used as appropriate. Further, as the inorganic compound, it may be any kind of an inorganic compound as long as it can easily accept electrons from the organic compound, and various metal oxides or metal nitrides can be used. In particular, a transition metal oxide belongs to any of Group 4 to Group 12 in the periodic table is preferable one because it is likely to show electron-accepting properties. Specifically, titanium oxide, zirconium oxide, vanadium oxide, molybdenum oxide, tungsten oxide, rhenium oxide, ruthenium oxide, zinc oxide, or the like can be used. Among these metal oxides, a transition metal oxide belonging to any of Group 4 to Group 8 in the periodic table is preferable one because many of them have a high electron-accepting property.

As the organic compound for the electron-transporting layer 347 formed of the organic compound with a light-emitting property and the inorganic compound having an electron-donating property with respect to the organic compound with a light-emitting property, the aforementioned organic compound with an electron-transporting property may be used as appropriate. Further, the inorganic compound may be any kind of an inorganic compound as long as it can easily donate electrons to the organic compound, and various metal oxides or metal nitrides can be used. In particular, alkali metal oxide, alkaline-earth metal oxide, rare earth metal oxide, alkali metal nitride, alkaline-earth metal nitride, or rare earth metal nitride is preferable one because it is likely to show an electron-donating property. Specifically, lithium oxide, strontium oxide, barium oxide, erbium oxide, lithium nitride, magnesium nitride, calcium nitride, yttrium nitride, lanthanum nitride, and the like are given.

The electron-transporting layer 347 or the hole-transporting layer 346, each of which is formed of an organic compound with a light-emitting property and an inorganic compound is superior in electron injecting/transporting properties. Therefore, various materials can be used for both of the first conductive layer 201 and the second conductive layer 204 hardly without limitation of work functions. Moreover, drive voltage can be reduced.

Next, as the layer containing the light-emitting substance, an inorganic EL element using an inorganic compound will be described.

Inorganic EL elements are classified as dispersion-type inorganic EL elements and thin-film inorganic EL elements, depending on their structures. They differ from one another in that the former include a layer having a light-emitting substance in which particles of a light-emitting material are dispersed in a binder and the latter include the layer having a light-emitting layer formed of a thin film of a light-emitting material. However, there is a common point in that they both require electrons accelerated by a high electric field. Further, mechanisms for obtaining light emission include donor-acceptor recombination light emission, which utilizes a donor level and an acceptor level, and localized light emission, which utilizes a core electron transition of a metal ion. In many cases, dispersion-type inorganic EL elements utilize donor-acceptor recombination light emission, while thin-film inorganic EL elements utilize localized light emission. A structure of an inorganic EL element is described below.

A light-emitting material that can be used in this embodiment mode includes a host material and an impurity element serving a light-emitting center. By varying the impurity element that is included, various colors of light emission can be obtained. Various methods such as a solid phase method or a liquid phase method (a coprecipitation method) can be used as a method for manufacturing the light-emitting material. Further, a liquid phase method, such as a spray pyrolysis method, a double decomposition method, a method which employs a pyrolytic reaction of a precursor, a reverse micelle method, a method in which one or more of the above methods is combined with high-temperature baking, or a freeze-drying method can be used.

In the solid phase method, the host material and an impurity element or a compound containing an impurity element are weighed, mixed in a mortar, and reacted by being heated and baked in an electric furnace, whereby the impurity element is included in the host material. The baking temperature is preferably 700 to 1500° C. This is because if the temperature is too low, a solid phase reaction will not proceed, and if the temperature is too high, the host material will be decomposed. It is preferable to bake the materials in pellet form, while the materials may be baked in powdered form. However baking at a relatively high temperature is necessary, due to its simplicity, this method has high productivity and is suitable for mass production.

The liquid phase method (a coprecipitation method) is a method in which the host material or a compound containing the host material, and an impurity element or a compound containing an impurity element, are reacted in a solution, dried, and then baked. Particles of the light-emitting material are distributed uniformly, and the reaction can proceed even if the particles are small and the baking temperature is low.

As a host material for the light-emitting material of the inorganic EL element, a sulfide, an oxide, or a nitride can be used. As a sulfide, for example, zinc sulfide (ZnS), cadmium sulfide (CdS), calcium sulfide (Cas), yttrium sulfide ($Y_2S_3$), gallium sulfide ($Ga_2S_3$), strontium sulfide (SrS), barium sulfide (BaS) can be used. Further, as an oxide, zinc oxide (ZnO), yttrium oxide ($Y_2O_3$), or the like can be used, for example. Moreover, as a nitride, aluminum nitride (AlN), gallium nitride (GaN), indium nitride (InN), or the like can be used, for example. Further, zinc selenide (ZnSe), zinc telluride (ZnTe), or the like can also be used. A ternary mixed crystal such as calcium gallium sulfide ($CaGa_2S_4$), strontium gallium sulfide ($SrGa_2S_4$), or barium gallium sulfide ($BaGa_2S_4$) may also be used.

As a light-emitting center for localized light emission, manganese (Mn), copper (Cu), samarium (Sm), terbium (Th), erbium (Er), thulium (Tm), europium (Eu), cerium (Ce), praseodymium (Pr), or the like can be used. Further, as charge compensation, a halogen element such as fluorine (F) or chlorine (Cl) may be added.

Meanwhile, as a light-emitting center for donor-acceptor recombination light emission, a light-emitting material including a first impurity element which forms a donor level and a second impurity element which forms an acceptor level can be used. As the first impurity element, fluorine (F), chlorine (Cl), aluminum (Al), or the like can be used, for example. As the second impurity element, copper (Cu), silver (Ag), or the like can be used, for example.

In the case of using a solid phase method to synthesize a light-emitting material of donor-acceptor recombination light emission, the host material, the first impurity element or a compound containing the first impurity element, and the second impurity element or a compound containing the second impurity element are weighed, mixed in a mortar, then heated and baked in an electric furnace. As the host material, any of the above mentioned host materials can be used. As the first impurity element or the compound containing the first impurity element, for example, fluorine (F), chlorine (Cl), or aluminum sulfide ($Al_2S_3$) can be used. As the second impurity element or the compound containing the second impurity element, for example, copper (Cu), silver (Ag), copper sulfide ($Cu_2S$), or silver sulfide ($Ag_2S$) can be used. The baking temperature is preferably 700 to 1500° C. This is because if the temperature is too low, a solid phase reaction will not proceed, and if the temperature is too high, the host material will be decomposed. Note that the materials may be baked in powdered form; however, it is preferable to bake the materials in pellet form.

Further, an impurity element for a case of employing a solid phase reaction, a compound containing a combination of the first impurity element and the second impurity element may be used. In such a case, since the impurity elements are diffused readily and a solid phase reaction proceeds readily, a uniform light-emitting material can be obtained. Further, since an unnecessary impurity element does not enter the light-emitting material, a light-emitting material with high purity can be obtained. As a compound containing the first impurity element and the second impurity element, for example, copper chloride (CuCl), silver chloride (AgCl) can be used.

Note that the concentration of the impurity elements may be 0.01 to 10 atomic percent relative to the host material, and is preferably in the range of 0.05 to 5 atomic percent.

Figure 5C:
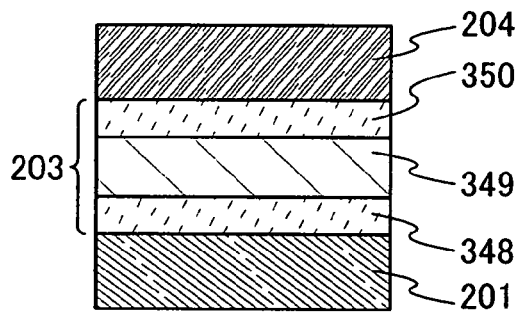

FIG. 5C shows a cross-section of an inorganic EL element in which the layer 203 containing the light-emitting substance includes a first insulating layer 348, a light-emitting layer 349, and a second insulating layer 350.

In the case of a thin film inorganic EL, the light-emitting layer 349 includes the light-emitting material mentioned above. The light-emitting layer 349 can be formed by a physical vapor deposition (PVD) method such as a sputtering method, a chemical vapor deposition (CVD) method such as a metal organic CVD method or a low-pressure hydride transport CVD method, an atomic layer epitaxy (ALE) method, or the like.

There is no particular limitation on the materials used for the first insulating layer 348 and the second insulating layer 350; however, preferably they have a high insulating property and form a dense film. In addition, preferably the materials for the insulating layers have a high dielectric constant. For example, silicon oxide ($SiO_2$), yttrium oxide ($Y_2O_3$), titanium oxide ($TiO_2$), aluminum oxide ($Al_2O_3$), hafnium oxide ($HfO_2$), tantalum oxide ($Ta_2O_5$), barium titanate ($baTiO_3$), strontium titanate ($SrTiO_3$), lead titanate ($PbTiO_3$), silicon nitride ($Si_3N_4$), zirconium oxide ($ZrO_2$), or a mixed film or a stacked film containing two or more of these materials can be used. The first insulating layer 348 and the second insulating layer 350 can be formed by sputtering, CVD, or the like. There is no particular limitation on the thickness of the first insulating layer 348 and the second insulating layer 350, but preferably, it is in the range of 10 to 1000 nm. Note that the light-emitting element of this embodiment mode does not necessarily require hot electrons, and therefore has an advantage that a thin film can be formed and drive voltage can be reduced. The film thickness is preferably less than or equal to 500 nm, more preferably less than or equal to 100 nm.

Although not shown, a buffer layer may be provided between the light-emitting layer 349 and the insulating layer 348 and 350 or between the light-emitting layer 349 and the conductive layer 201 and 204. The buffer layer facilitates carrier injection and suppresses mixture of the layers. There is no particular limitation on the material of the buffer layer. However, for example, ZnS, ZnSe, ZnTe, CdS, SrS, BaS, which are the host materials for the light-emitting layer; CuS; $Cu_2S$; or LiF, $CaF_2$, $BaF_2$, $MgF_2$, which are alkali halide, can be used.

Figure 5D:
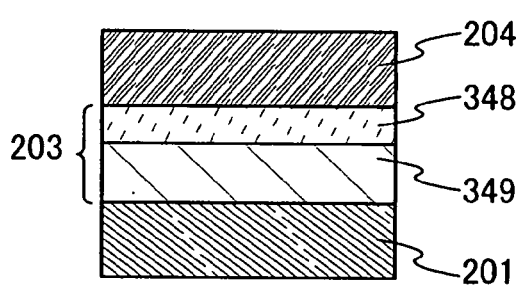

Moreover, as shown in FIG 5D, the layer 203 containing the light-emitting substance may be formed of the light-emitting layer 349 and the first insulating layer 348. In this case, in FIG. 5D, the first insulating layer 348 is provided between the second conductive layer 204 and the light-emitting layer 349. Note that the first insulating layer 348 may be provided between the first conductive layer 201 and the light-emitting layer 349.

Further, the layer 203 containing the light-emitting substance may be formed of only the light-emitting layer 349. In other words, the light-emitting element may be formed of the first conductive layer 201, the layer 203 containing the light-emitting substance, and the second conductive layer 204.

In the case of a dispersion-type inorganic EL, the layer containing the light-emitting substance, which has a film form, is formed by dispersing particles of a light-emitting material in a binder. When particles with a desired size cannot be obtained sufficiently by a method for manufacturing the light-emitting material, the material may be processed into particles by being crushed in a mortar or the like. A binder is a substance for fixing the dispersed particles of light-emitting material in a particle form and maintaining the shape of the layer containing the light-emitting substance. The light-emitting material is dispersed evenly throughout the layer containing the light-emitting substance and fixed by the binder.

In the case of the dispersion-type inorganic EL element, the layer containing the light-emitting substance can be formed by a droplet discharge method that can selectively form the layer containing the light-emitting substance, a printing method (such as screen printing or offset printing), a coating method such as a spin coating method, a dipping method, a dispenser method, or the like. There is no particular limitation on the thickness of the layers. However, it is preferably in the range of 10 to 1000 nm. Further, the proportion of the light-emitting material in the layer containing the light-emitting substance, which includes the light-emitting material and the binder, is preferably in the range of 50 to 80 wt %, inclusive.

Figure 5E:
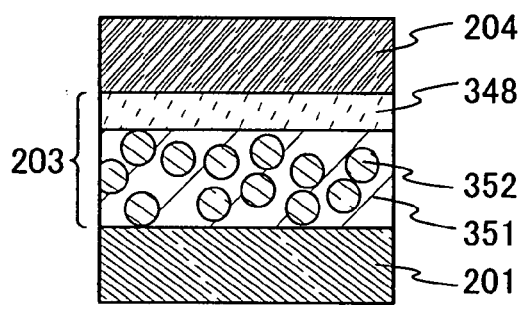

An element shown in FIG. 5E has the first conductive layer 201, the layer 203 containing the light-emitting substance, and the second conductive layer 204. The layer 203 containing the light-emitting substance is formed of a light-emitting layer in which a light-emitting material 352 is dispersed in a binder 351 and the insulating layer 348. FIG 5E shows a structure in which the insulating layer 348 is in contact with the second conductive layer 204; however, a structure in which the insulating layer 348 is in contact with the first conductive layer 201 may also be used. Moreover, the element may have insulating layers formed in contact with each of the first conductive layer 201 and the second conductive layer 204. Further, the element may not have insulating layers formed in contact with each of the first conductive layer 201 and the second conductive layer 204.

As a binder which can be used in this embodiment mode, insulating materials such as an organic material or an inorganic material can be used. A mixed material containing an organic material and an inorganic material may also be used. As an organic insulating material, a polymer with a relatively high dielectric constant, such as a cyanoethyl cellulose-based resin, or a resin such as a polyethylene-based resin, a polypropylene-based resin, and a polystyrene-based resin, a silicone resin, an epoxy resin, or a vinylidene fluoride resin can be used. Further, a heat-resistant high molecular material such as aromatic polyamide or polybenzimidazole or a siloxane resin may also be used. A siloxane resin is a resin, which includes a Si—O—Si bond. Siloxane is a material, which has a skeleton structure by the bond of silicon (Si) and oxygen (O). As a substituent, an organic group containing at least hydrogen (for example, an alkyl group or an aromatic hydrocarbon) can be used. Alternatively, a fluoro group may be used as a substituent. Further, alternatively, both an organic group containing at least hydrogen and a fluoro group may be used as a substituent. Further, the following resin materials may also be used: a vinyl resin such as polyvinyl alcohol or polyvinylbutyral, a phenol resin, a novolac resin, an acrylic resin, a melamine resin, an urethane resin, an oxazole resin (polybenzoxazole), or the like. Further, a photocurable resin or the like can be used. Fine particles with a high dielectric constant, such as particles of barium titanate ($BaTiO_3$) or strontium titanate ($SrTiO_3$), can be mixed with these resins as appropriate to adjust the dielectric constant.

Further, the inorganic insulating material used for the binder can be formed using silicon oxide ($SiO_x$), silicon nitride ($SiN_x$), silicon containing oxygen and nitrogen, aluminum nitride (AlN), aluminum containing oxygen and nitrogen, aluminum oxide ($Al_2O_3$), titanium oxide ($TiO_2$), $BaTiO_3$, $SrTiO_3$, lead titanate ($PbTiO_3$), potassium niobate ($KNbO_3$), lead niobate ($PbNbO_3$), tantalum oxide ($Ta_2O_5$), barium tantalate ($BaTa_2O_6$), lithium tantalate ($LiTaO_3$), yttrium oxide ($Y_2O_3$), zirconium oxide ($ZrO_2$), ZnS, or other substances containing an inorganic insulating material. By including an inorganic material with a high dielectric constant in the organic material (by doping or the like), the dielectric constant of the layer containing the light-emitting substance, which includes the light-emitting material and the binder, can be further controlled, and the dielectric constant can be further increased.

In the manufacturing process, the light-emitting material is dispersed in a solution containing a binder. As a solvent for the solution containing a binder that can be used in this embodiment mode, a solvent in which the binder material is dissolved and which can form a solution with viscosity that is suitable for the method of forming the light-emitting layer (the various wet processes) and for a desired film thickness may be selected appropriately. An organic solvent or the like can be used. For example, when a siloxane resin is used as the binder, propylene glycolmonomethyl ether, propylene glycolmonomethyl ether acetate (also called PGMEA), 3-methoxy-3methyl-1-butanol (also called MMB), or the like can be used as the solvent.

In the inorganic EL light-emitting element, light emission is obtained when a voltage is applied between a pair of electrodes which sandwich the layer containing the light-emitting substance, and the element can be operated by either direct current drive or alternating current drive.

Here, as a light-emitting element displaying a red color, an ITO layer containing silicon oxide is formed to a thickness of 125 nm as the second conductive layer which functions as a first pixel electrode. As the light-emitting layer, DNTPD formed in 50 nm, NPB formed in 10 nm, NPB doped with bis[2,3-bis(4-fluorophenyl)quinoquixalinato]iridium(acetylacetonate) (abbreviation: Ir(Fdpq)$_2$(acac)) which is formed to a thickness of 30 nm, Alq$_3$ formed to a thickness of 30 nm, and LiF formed to a thickness of 1 nm are stacked. As a third conductive layer functioning as a second pixel electrode, an Al layer is formed to a thickness of 200 nm.

As a light-emitting element displaying a green color, an ITO layer containing silicon oxide is formed to a thickness of 125 nm as a second conductive layer functioning as a first pixel electrode. As the light-emitting layer, DNTPD formed to a thickness of 50 nm, NPB formed to a thickness of 10 nm, Alq$_3$ doped with coumarin 545T (C545T) which is formed in 40 nm thick, Alq$_3$ formed in 30 nm thick, and LiF formed to a thickness of 1 nm are stacked. As a third conductive layer functioning as a second pixel electrode, an Al layer is formed to a thickness of 200 nm.

Further, as a light-emitting element displaying a blue color, an ITO layer containing silicon oxide is formed to a thickness of 125 nm as a second conductive layer serving as a first electrode. As the light-emitting layer, DNTPD formed to a thickness of 50 nm, NPB formed to a thickness of 10 nm, 9-[4-(N-carbazolyl)]phenyl-10-phenylanthracene (abbreviation: CzPA) doped with 2,5,8,11-tetra(tert-butyl)perylene (abbreviation: TBP) which is formed to a thickness of 30 nm, Alq$_3$ formed to a thickness of 30 nm, and LiF formed to a thickness of 1 nm are stacked. For a third conductive layer serving as a second pixel electrode, an Al layer is formed to a thickness of 200 nm.

By employing a manufacturing process in this embodiment mode, wettability over a photocatalytic conductive layer, which serves as pixel electrodes, can be improved. Thus, adhesion between the pixel electrodes and a light-emitting layer is improved and a highly reliable light-emitting element can be manufactured. In addition, irradiation with ultraviolet light makes it possible to form a region with high wettability on the photocatalytic conductive layer, which serves as the pixel electrodes. As a result, the highly reliable light-emitting element can be manufactured without complicated steps.

(Embodiment Mode 3)

In this embodiment mode, steps for forming regions having different wettability over a substrate and for forming a convex conductive layer in a region with high wettability will be described with reference to the drawings.

Figure 6A:
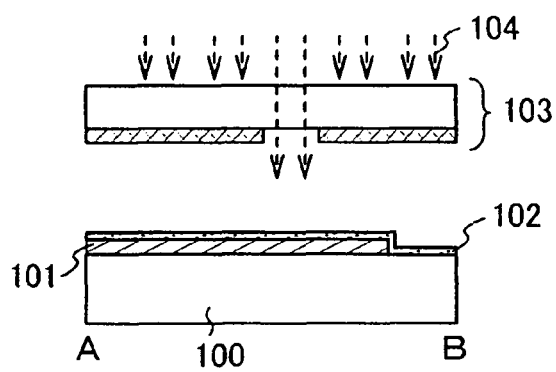
FIGS. 6A to 6F illustrate steps for manufacturing a convex conductive layer using a photocatalytic conductive layer and a photocatalytic reaction layer.

First, a first conductive layer 101 is formed over a substrate 100 (FIG. 6A).

The substrate 100 may be a glass substrate, a quartz substrate, a plastic substrate, a substrate formed of an insulating substance such as ceramic like alumina, a silicon wafer, a metal plate, or the like. A plastic substrate is typically formed of polyethylene naphthalate (PEN), polyether sulfone (PES), polypropylene, polypropylene sulfide, polycarbonate (PC), polyphenylene sulfide, polyphenylene oxide, polyethylene terephthalate (PET), polyphtalamide, nylon, polyether ether ketone (PEEK), polysulfone (PSF), polyether imide (PEI), polyarylate (PAR), polybutylene terephthalate (PBT), or polyimide. Alternatively, the plastic substrate may also be formed of an organic material into which inorganic particles with a diameter of several nanometers is dispersed. The substrate 100 may have flexibility.

Note that a conductive layer similar to the photocatalytic conductive layer 13 in Embodiment Mode 1 can be employed for the first conductive layer 101.

Subsequently, a photocatalytic reaction layer 102 is formed over the first conductive layer 101. As the photocatalytic reaction layer 102, a reaction layer similar to the photocatalytic reaction layer 14 in Embodiment Mode 1 can be employed.

Next, the photocatalytic reaction layer 102 is irradiated with ultraviolet light 104 using a photo mask 103. Accordingly, a region 112 with conductivity and high wettability can be formed in the region irradiated with ultraviolet light 104 can be formed (FIG. 6B). It is to be noted that a region of which wettability is not altered due to no irradiation with ultraviolet light 104 is referred to as a region with low wettability After a composition containing conductive particles (hereinafter referred to as a conductive paste) is discharged into the region with high wettability, the conductive paste is dried and baked to form a convex conductive layer (a pillar) 121 formed of a conductive material. The convex conductive layer (the pillar) 121 is piled with the conductive paste, which is discharged and baked repeatedly (FIG. 6C). Note that the convex conductive layer (the pillar) 121 function as a conductive layer (a multilayer wiring).

As the conductive paste, conductive particles having a diameter of several nanometers to several micrometers are dissolved or dispersed into an organic resin. As the conductive particles, particles of one or more metal particles selected from Ag, Au, Cu, Ni, Pt, Pd, Ir, Rh, W, Al, Ta, Mo, Cd, Zn, Fe, Ti, Zr, or Ba, silver halide particles, or dispersible nanoparticles can be employed. Conductive layers formed of these materials can be stacked to form the convex conductive layer (the pillar) 121. The organic resin can be one or more kinds of organic resins that serve as a binder of metal particles, a solvent, a dispersing agent, and a coating agent. Typically, an organic resin such as an epoxy resin and a silicone resin may be used.

The region with high wettability 112 is coated with the conductive paste by a droplet discharge method or the like. The convex conductive layer (the pillar) is formed by conductive particles stacked three-dimensionally and irregularly. That is, the conductive layer includes three-dimensional aggregate particles. Thus, a surface thereof is slightly uneven. In addition, depending on the heating temperature and heating time of the conductive paste, the conductive particles are dissolved to form aggregation of the conductive particles. The grain size of the conductive particles at this time increases with the heating temperature and heating time of the conductive paste; therefore, the conductive layer has a surface with a big difference in elevation. Note that in some cases a region into which the conductive particles are dissolved has a polycrystalline structure.

In the conductive layer, a binder formed of an organic material is left depending on the heating temperature, atmosphere, and time. A composition containing silver particles having a diameter of several nm to several tens nm is used for the conductive paste.

Since the region with low wettability is formed on the periphery of the region of the discharged conductive paste, the conductive paste does not spread and the pillar can be controlled to have uniform width in diameter. As a result, the convex conductive layer (the pillar) 121 formed of a conductive material with little variation can be formed.

Figure 6D:
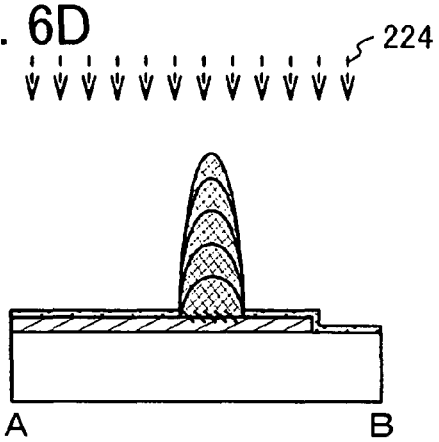
Figure 6B:
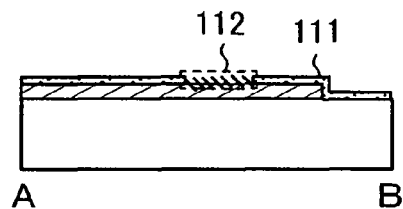
Figure 6E:
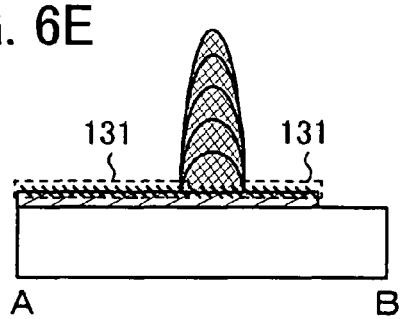
Figure 6C:
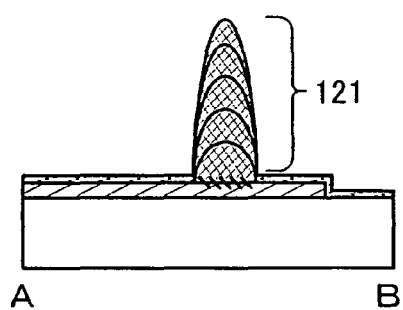

Next, the region with low wettability 111 is irradiated with laser or light 224 (FIG. 6D). When the region with low wettability 111 is exposed, a bond of a substance is dissociated by energy of light, and a region with high wettability 131 is formed over the first conductive layer 101 (FIG. 6E). Note that it is not necessarily need for the region with low wettability 111 to be irradiated with light to alter the wettability of the region with low wettability 111 in this step.

Here, when FAS is used for the photocatalytic reaction layer, irradiation with ultraviolet light is performed as light 224 for dissociating a bond of FAS. In such a case, it is preferable to fill with oxygen between the region with low wettability 111 and a lamp. By irradiating oxygen with ultraviolet light, ozone is generated and dissociation of the bond of FAS is easily performed.

After that, using a coating method, an interlayer insulating film 160 is formed such that the convex conductive layer (the pillar) 121 is embedded in the interlayer insulating film 160 and a top of the convex conductive layer (the pillar) 121 is exposed. Alternatively, after the interlayer insulating film 160 is formed so as to cover the convex conductive layer (the pillar) 121, a top of the convex conductive layer (the pillar) 121may be exposed. For the interlayer insulating film to be formed, the following materials can be given: an organic resin such as acrylic, or polyimide; a coated silicon oxide film so-called (also referred to as Spin On Glass 'SOG'), which forms films by heat treatment after coating insulating materials dissolved in an organic solvent, a material in which a siloxane bond is formed by baking a siloxane polymer, and the like. In addition, a method for forming the material of the interlayer insulating film 160 is not limited to a coating method, and an inorganic insulating film such as a coated silicon oxide film formed by a vapor deposition method or a sputtering method can be used. Moreover, a protective film may be formed of silicon nitride by a PCVD method or a sputtering method, and then an insulating film may be stacked by a coating method.

Further, the interlayer insulating film 160 may be formed by a droplet discharge method. The interlayer insulating film 160 may be formed by a droplet discharge method before performing main baking of the convex conductive layer (the pillar) 121, and main baking of the two may be performed simultaneously. In addition, the interlayer insulating film 160 may be planarized.

In forming the interlayer insulating film 160 by a coating method or a droplet discharge method, main baking of the interlayer insulating film 160 is preferably performed after a minute unevenness of its surface is planarized using not a squeegee but an air knife.

Subsequently, the interlayer insulating film over the convex conductive layer (the pillar) 121 is removed by entire etch back to expose the convex conductive layer (the pillar) 121. As another method, the interlayer insulating film is grounded by chemical mechanical polishing (CMP). Afterwards, by entire etch back of the interlayer insulating film, the convex conductive layer (the pillar) 121 can be exposed.

Figure 6F:
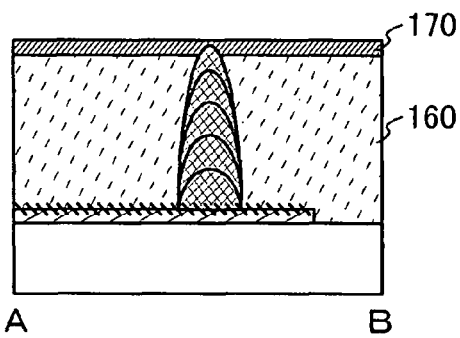

Subsequently, a second conductive layer (a conductor) 170, which is in contact with the convex conductive layer (the pillar) 121, is formed over the interlayer insulating film 160 (FIG. 6F). A predetermined pattern formed of a composition containing indium tin oxide (ITO), indium tin oxide containing silicon oxide, zinc oxide (ZnO), tin oxide ($SnO_2$), or the like may be formed by a droplet discharge method or a printing method. Then, the predetermined pattern may be baked to form the second conductive layer. Further, by a droplet discharge method, the predetermined pattern can be formed using a composition of which a main component is particles of metal such as Ag (silver), Au (gold), Cu (copper), W (tungsten), Al (aluminum). As another method, the second conductive layer may be formed by forming a transparent conductive film or a light reflecting conductive film by a sputtering method, forming a mask pattern by a droplet discharge method, and combining etching.

In this embodiment mode, using a simple method of forming a photocatalytic reaction layer over a film including a conductive material containing ITO mixed with silicon oxide and irradiating the film including a conductive material with ultraviolet light, a region with conductivity and higher wettability than the photocatalytic reaction layer can be formed on surface of the film including a conductive material containing ITO mixed with silicon oxide. Accordingly, a convex conductive layer (a multilayer wiring) connecting a first conductive layer to a second conductive layer can be accurately formed without complicated steps. Further, an element with improved adhesion between the first conductive layer and the convex conductive layer (the multilayer wiring) can be easily manufactured. As a result, a highly reliable semiconductor device can be easily manufactured without complicated steps.
(Embodiment Mode 4)

In this embodiment mode, a process for manufacturing a display device having the organic transistor shown in Embodiment Mode 1 will be described.

Figure 7:
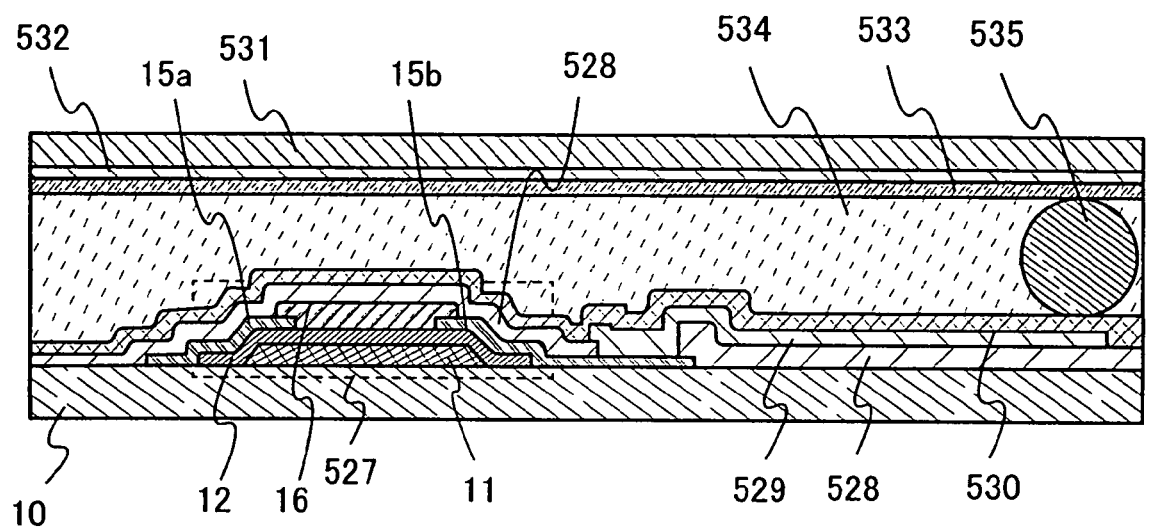
FIG. 7 illustrates an example of a structure of a liquid crystal display device.

First, an organic transistor 527 is formed over the substrate 10 (FIG. 7). The organic transistor 527 can be formed in a similar manner to Embodiment Mode 1.

Subsequently, an insulating layer 528 covering the organic transistor 527 is formed. As a material for the insulating layer 528, the following can be used: an inorganic insulating material such as silicon oxide, silicon nitride, silicon oxynitride, aluminum oxide, aluminum nitride, or aluminum oxynitride; acrylic acid, methacrylic acid, or a derivative of these acid; heat-resistant high molecular compound such as polyimide, aromatic polyamide, or polybenzimidazole; inorganic siloxane polymer, which has the Si—O—Si bond among compounds composed of silicon, oxygen, and hydrogen formed using a siloxane polymer based material such as silica glass as a starting material; an organic siloxane polymer based insulating material in which silicon on hydrogen is substituted by an organic group such as methyl or phenyl typified by alkylsiloxane polymer, alkylsilsesquioxane polymer, hydrogenated silsesquioxane polymer, hydrogenated alkylsilsesquioxane polymer. As a method for forming the insulating layer 528, a CVD method, a coating method, or a printing method is used. Using a coating method, the surface of the insulating layer can be planarized.

Next, a contact hole which exposes the conductive layer 15b in the insulating layer 528 is formed. Then, a conductive layer 529 is formed over the insulating layer, and a pixel electrode which is connected to the conductive layer 15b functioning as a source electrode or a drain electrode through the contact hole is formed. As the conductive layer 529, either a transparent electrode which transmits light or a reflective electrode which reflects light can be used. In the case of the transparent electrode, for example, an indium tin oxide (ITO) film in which tin oxide is mixed into indium oxide, an indium tin silicon oxide (ITSO) film in which silicon oxide is mixed into indium tin oxide (ITO), an indium zinc oxide (IZO) film in which zinc oxide is mixed into indium oxide, a zinc oxide film, a tin oxide film, or the like can be used. It is to be noted that IZO is a transparent conductive material formed by sputtering using a target in which 2 to 20 wt % of zinc oxide (ZnO) is mixed into ITO, however it is not limited to this. In the case of the reflective electrode, for example, Ti, Mo, Ta, Cr, W, Al, Nd, Cu, Ag, Au, Pt, Nb, Si, Zn, Fe, Ba, Ge, or an alloy of these elements can be used. Alternatively, a two-layer structure in which Ti, Mo, Ta, Cr, or W and Al are stacked or a three-layer structure in which Al is interposed between metals such as Ti, Mo, Ta, Cr, and W may be used. With employment of these materials, the conductive layer 529 can be formed by a photolithography method, an ink jet method, a printing method, or the like.

Then, a liquid crystal layer 534 is disposed between a counter electrode 532 formed on a counter substrate 531 and the conductive layer 529 functioning as a pixel electrode. Orientation films 533 and 530 are provided respectively on the surface of the counter electrode 532, and the surface of the conductive layer 529, which functions as the pixel electrode, on the sides which are in contact with the liquid crystal layer 534. Consequently, a liquid crystal display is completed.

Note that a cell gap of the liquid crystal layer 534 is kept using a spacer 535. A structure of the liquid crystal display device is not limited particularly. Although not shown, the substrate 10 is attached to the counter substrate 531 with a seal material. A liquid crystal for the liquid crystal layer 534 can be freely used without particular limitation on a kind of the liquid crystal layer 534. For example, a ferroelectric liquid crystal or an antiferroelectric liquid crystal may be used for the liquid crystal layer 534. In addition, among a driving method of the liquid crystal, the following can be freely used: TN (Twisted Nematic) mode, an MVA (Multi-domain Vertical Alignment) mode, an ASM (Axially Symmetric aligned Micro-cell) mode, an OCB (Optical Compensated Bend) mode, or the like.

Figure 8A:
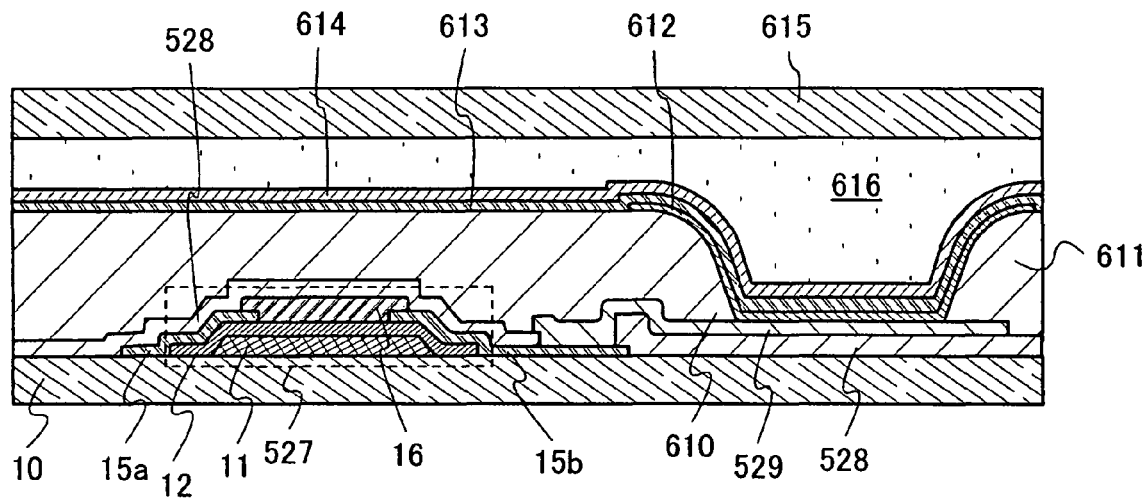
FIGS. 8A and 8B illustrate examples of structures of EL display devices.

As to application for a display device, there is no limitation on a crystal liquid display device, and it can be employed for an EL display device too. With reference to FIG. 8A, a structure of an EL display device will be described.

The organic transistor 527 formed over the substrate 10 is covered with the insulating layer 528. The conductive layer 15b serving as a portion of the source and drain electrodes is electrically connected to the conductive layer 529 serving as a first electrode through the contact hole. An end portion of the conductive layer 529 serving as the first electrode is covered with an insulating layer 611, and a light-emitting layer 612 is formed so as to cover a portion exposed from the insulating layer 611. A second electrode 613 and a passivation film 614 are formed over the light-emitting layer 612. Note that the light-emitting layer 612 is isolated from the air by sealing the substrate 10 and a counter substrate 615 with the sealing material (not shown) outside of a pixel portion. A space 616 between the counter substrate 615 and the substrate 10 may be filled with an inert gas such as dried nitrogen, or sealing may be performed by filling the space 616 with a resin or the like instead of the sealing material. The structure of the EL display is not limited particularly.

Note that although not shown here, the conductive layer 529 serving as the first electrode may be formed of a photocatalytic conductive layer material, a photocatalytic reaction layer may be formed over the photocatalytic conductive layer, and irradiation with ultraviolet light may be performed to improve wettability of a surface of the conductive layer 529. In this way, adhesion between the conductive layer 529 and the light-emitting layer 612 can be improved.

Figure 8B:
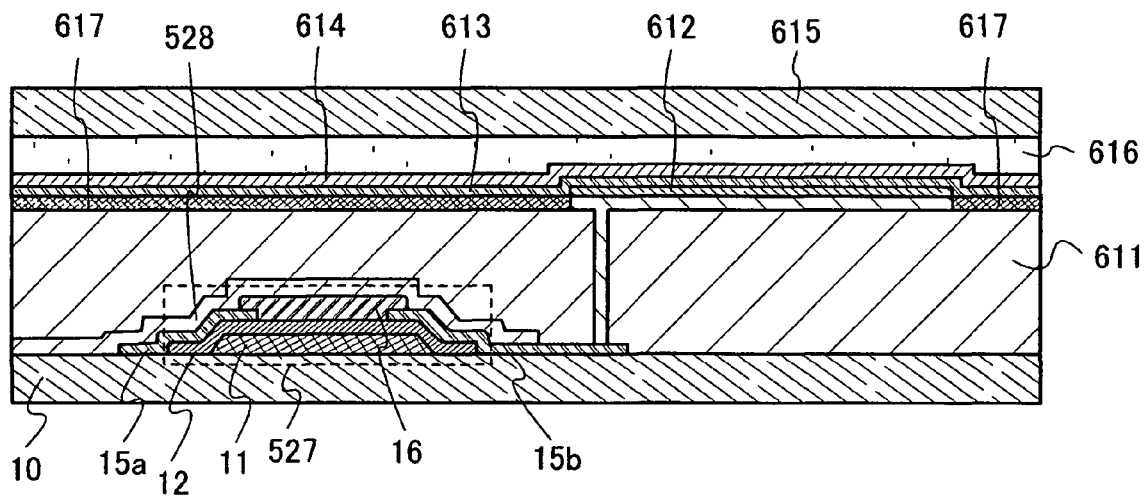

Next, an EL display device which has a different structure from that of FIG. 8A will be described with reference to FIG. 8B. In the EL display device shown in FIG. 8B, the organic transistor 527 is formed over the substrate 10; the insulating layer 528 is formed over the organic transistor 527; the insulating layer 611 is formed over the insulating layer 528; and the conductive layer 529 serving as the first electrode is formed over the insulating layer 611. In addition, the conductive layer 15b serving as a portion of the source and the drain electrodes of the organic transistor 527 is electrically connected to the conductive layer 529 functioning as the first electrode through a contact hole formed in the insulating layer 611. In FIG. 8B, a photocatalytic reaction layer 617 is formed over the insulating layer 611 and on a side of the conductive layer 529 serving as the first electrode. The light-emitting layer 612 is selectively formed only over the conductive layer 529 serving as the first electrode. Over the light-emitting layer 612 and the photocatalytic reaction layer 617, the second electrode 613 and the passivation film 614 are formed. Note that the light-emitting layer 612 is isolated from the air by sealing the substrate 10 and the counter substrate 615 with a seal material (not shown) outside the pixel portion. The space 616 between the counter substrate 615 and the substrate 10 may be filled with an inert gas such as dried nitrogen, and the space 616 may be sealed by filling with a resin instead of the seal material. The structure of the EL display device is not limited particularly.

In FIG. 8B, the EL display device takes steps for forming the conductive layer 529, which serves as the first electrode, of a material for the photocatalytic conductive layer, forming the photocatalytic reaction layer over the photocatalytic conductive layer, and irradiating the surface of the conductive layer 529 with ultraviolet light to improve wettability of the same. Therefore, adhesion between the conductive layer 529 and the light-emitting layer 612 is improved. Moreover, since the photocatalytic reaction layer is left over the insulating layer 611 and on the side of the conductive layer 529, a step formed by the conductive layer 529 and the insulating layer 611 can be relieved and disconnection of the second electrode 613 formed over the light-emitting layer 612 can be prevented.

A manufacturing process described in Embodiment Mode 1 is employed for the organic transistor 527 in this embodiment mode; therefore, a highly reliable display device can be easily manufactured without complicated steps.

(Embodiment Mode 5)

As electronic apparatuses having the semiconductor device described in the foregoing embodiment mode, the following can be given: television devices (also referred to as TVs or television receivers), cameras such as digital cameras or digital video cameras, mobile phone units (also referred to as cellular phone handsets or cellular phones), portable information terminals such as PDAs, portable game machines, monitors for computers, computers, sound reproduction devices such as car audios, image reproduction devices having recording media such as home game machines, or the like. Specific examples are described with reference to FIGS. 9A to 9F.

Figure 9A:
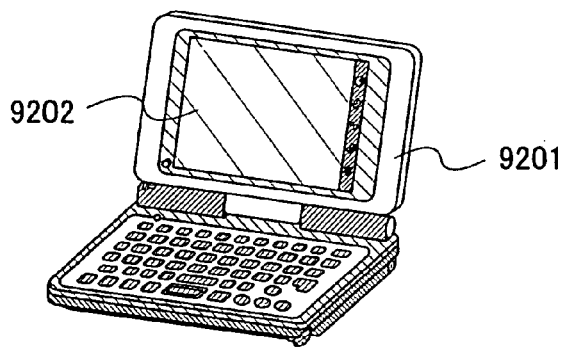
FIGS. 9A to 9F illustrate examples of electronic apparatuses.

A portable information terminal shown in FIG. 9A includes a main body 9201, a display portion 9202, and the like. With application of the semiconductor device described in the foregoing embodiment mode to the display portion 9202, a high quality portable information terminal can be easily manufactured.

Figure 9B:
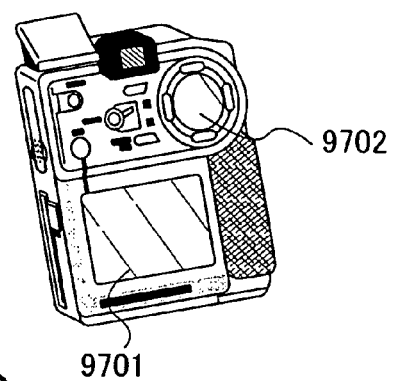

A digital video camera shown in FIG. 9B includes a display portion 9701, a display portion 9702, and the like. With application of the semiconductor device described in the foregoing embodiment mode to the display portion 9701, a high quality digital video camera can be easily manufactured.

Figure 9C:
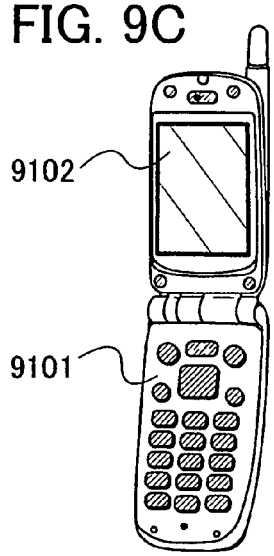

A portable information terminal shown in FIG. 9C includes a main body 9101, a display portion 9102, and the like. With application of the semiconductor device described in the foregoing embodiment mode to the display portion 9102, a high quality portable information terminal can be easily manufactured.

Figure 9D:
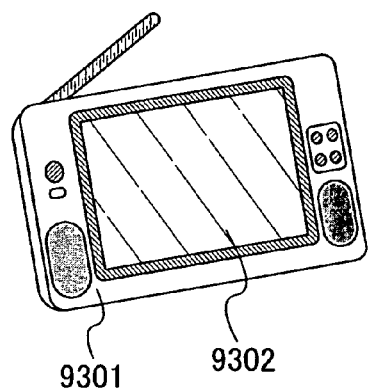

A portable television device shown in FIG. 9D includes a main body 9301, a display portion 9302, and the like. With application of the semiconductor device described in the foregoing embodiment mode to the display portion 9302, a high quality portable television device can be easily manufactured. Such a television device can be widely applied to from a small sized television installed in a portable terminal such as a mobile phone, a middle sized portable television, and a large sized television (for example, 40 inches or more).

Figure 9E:
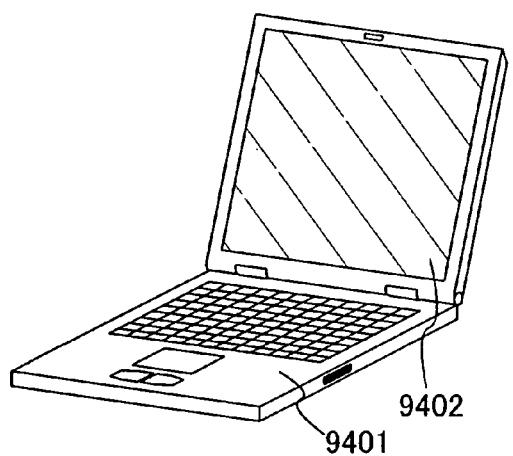

A portable computer shown in FIG. 9E includes a main body 9401, a display portion 9402, and the like. With application of the semiconductor device described in the foregoing embodiment mode to the display portion 9402, a high quality portable computer can be easily manufactured.

Figure 9F:
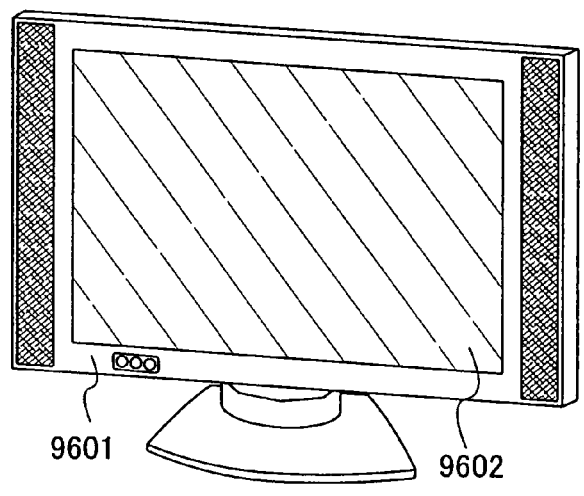

A television device shown in FIG. 9F includes a main body 9601, a display portion 9602, and the like. With application of the semiconductor device described in the foregoing embodiment mode to the display portion 9602, a high quality television device can be easily manufactured.

Here, a structure of the television device will be described with reference to FIG. 10.

Figure 10:
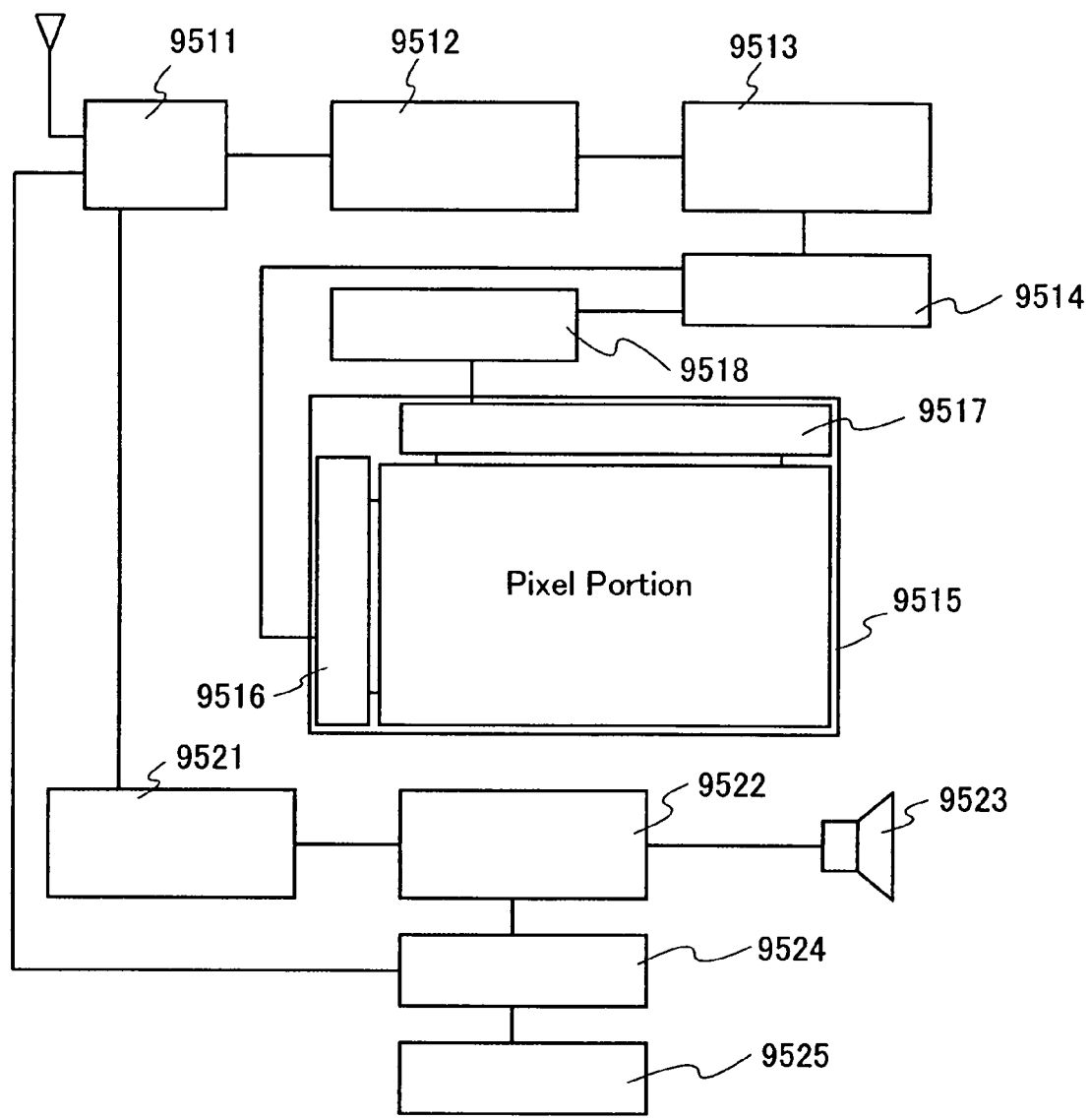
FIG. 10 illustrates an example of an electronic apparatus.

FIG. 10 is a block diagram showing a main structure of the television device. A tuner 9511 receives a video signal and an audio signal. The video signal is processed through a video detection circuit 9512, a video signal processing circuit 9513 for converting a signal outputted from the video detection circuit 9512 into a color signal corresponding to each color of red, green, and blue, and a control circuit 9514 for converting the video signal in accordance with an input specification of a driver IC. The control circuit 9514 outputs signals to a scan line driver circuit 9516 and a signal line driver circuit 9517 of a display panel 9515. In the case of performing digital driving, a signal dividing circuit 9518 may be provided on a signal line side so that an inputted digital signal is divided into m signals to be supplied.

In FIG. 10, among the signals received by the tuner 9511, the audio signal is transmitted to an audio detection circuit 9521 and its output is supplied to a speaker 9523 through an audio signal processing circuit 9522. The control circuit 9524 receives control information about a receiving station (receiving frequency) and sound volume from an input portion 9525, and then transmits signals to the tuner 9511 and the audio signal processing circuit 9522.

This television device includes the semiconductor device described in the foregoing embodiment mode. As a result, a high quality television device can be easily manufactured.

Note that the present invention is not limited to the television receiver and can be applied to various ways. In particular, display media with a large area such as an information display board at a railway station, an airport, or the like, or an advertisement display board on the street as well as a monitor of a personal computer.

[Embodiment 1]

In this embodiment, experimental results on two cases where changes in a contact angle at a surface of a substrate over time were measured will be described. One case is that a FAS film was formed over a glass substrate and irradiated with ultraviolet light, and the other case is that a film including a conductive material containing ITO mixed with silicon oxide and a FAS film were formed on a surface of a glass substrate and irradiated with ultraviolet light. Note that contact angles to water were measured.

First, a sample 1 in which a FAS film is formed over a glass substrate and a sample 2 in which a film including a conductive material containing ITO mixed with silicon oxide of which a thickness was 110 nm were formed over a glass substrate and a FAS film was formed thereover were prepared. Next, the FAS films of the samples 1 and 2 were irradiated with ultraviolet light, respectively. Then, changes in contact angles to water on surfaces of the substrates when the time of irradiation with ultraviolet light was changed were measured.

Figure 11:
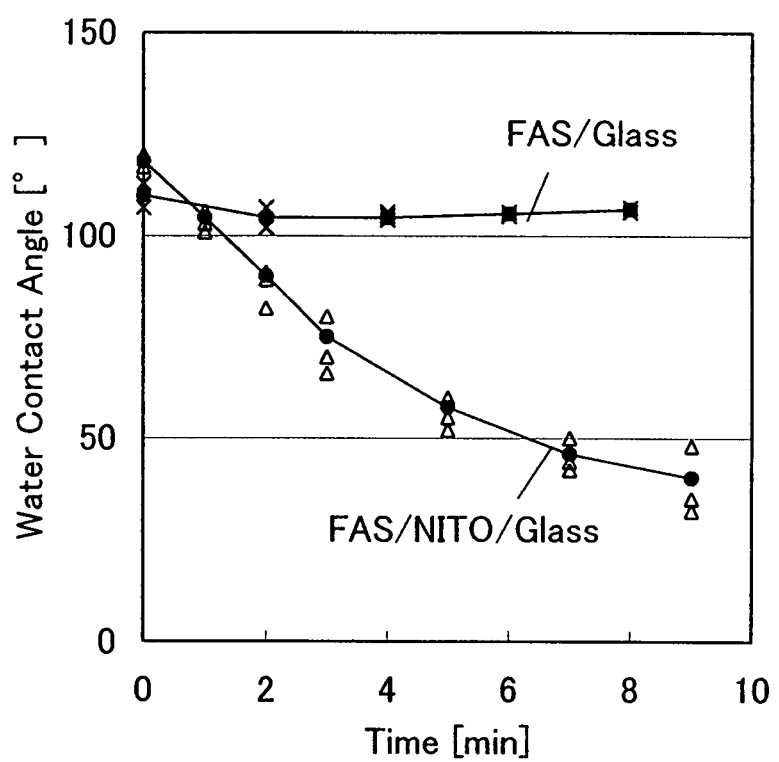
FIG. 11 illustrates an experimental result as to changes in a contact angle over time.

FIG. 11 illustrates a graph showing changes in the contact angles of the samples 1 and 2 over time. Here, a vertical axis indicates a contact angle to water. A horizontal axis indicates the time of irradiation with ultraviolet light toward the samples 1 and 2. FIG. 11 shows that the smaller the contact angle to water is, the higher surface wettability of the substrates becomes. Further, in FIG. 11, plots represented by a cross indicate changes in the contact angle of the sample 1, and plots represented by an outline triangle indicate changes in contact angles of the sample 2.

From FIG. 11, it can be seen that the contact angle hardly changes regardless of passage of time for irradiation with ultraviolet light in the sample 1. However, in the sample 2, it can be seen that the longer the time of irradiation with ultraviolet light gets, the smaller the contact angle becomes, and the higher wettability becomes. Accordingly, it can be seen that wettability improves by irradiation with ultraviolet light of the FAS film formed over a film including the conductive material containing ITO mixed with silicon oxide.

By steps for forming a film including a conductive material containing ITO mixed with silicon oxide as a photocatalytic conductive layer, forming a FAS film over the photocatalytic conductive layer as a photocatalytic reaction layer, and irradiating at least a surface of the photocatalytic conductive layer with ultraviolet light, it can be seen that, in a portion irradiated with ultraviolet light, wettability of the surface of the film including the conductive material containing ITO mixed with silicon oxide can be improved. Accordingly, when a region irradiated with ultraviolet light or a region with no irradiation with ultraviolet light is selectively provided to the photocatalytic conductive layer, regions having different wettability can be formed over the photocatalytic conductive layer. A surface of the photocatalytic conductive layer, which is irradiated with ultraviolet light, has conductivity and is a region with high wettability. Consequently, in the case of manufacturing a semiconductor device including a process of connecting two layers including conductive materials, employment of the foregoing methods makes it possible to improve adhesion between the photocatalytic conductive layer and the conductive material formed over the region with high wettability. In this way, a highly reliable semiconductor device can be easily manufactured.

This application is based on Japanese Patent Application serial no. 2006-282296 filed in Japan Patent Office on Oct. 17, in 2006, the entire contents of which are hereby incorporated by reference.

What is claimed is:

1. A method for manufacturing a semiconductor device, comprising the steps of:
   forming a photocatalytic conductive layer over a substrate;
   forming a reaction layer over the photocatalytic conductive layer; and
   irradiating a surface of the photocatalytic conductive layer with ultraviolet light to form a region with conductivity and higher wettability than the reaction layer on the surface of the photocatalytic conductive layer.

2. A method for manufacturing a semiconductor device, comprising the steps of:
   forming a gate electrode over a substrate;
   forming an insulating layer over the gate electrode;
   forming a photocatalytic conductive layer over the insulating layer;
   forming a reaction layer over the photocatalytic conductive layer,
   irradiating a surface of the photocatalytic conductive layer with ultraviolet light to form a region with conductivity and higher wettability than the reaction layer on the surface of the photocatalytic conductive layer;
   forming a mask layer by discharging a liquid pattern material into the region with high wettability;
   forming a conductive layer by etching the photocatalytic conductive layer with the use of the mask layer; and
   forming an organic semiconductor layer to cover at least a part of the conductive layer.

3. A method for manufacturing a semiconductor device, comprising the steps of:
   forming a photocatalytic conductive layer over a substrate;
   forming a reaction layer over the photocatalytic conductive layer;
   irradiating a surface of the photocatalytic conductive layer with ultraviolet light to form a region with conductivity and higher wettability than the reaction layer on the surface of the photocatalytic conductive layer;
   forming a layer having a light-emitting substance by discharging a liquid light-emitting material into the region with high wettability; and
   forming a conductive layer over the layer having the light-emitting substance.

4. A method for manufacturing a semiconductor device, comprising the steps of:
   forming a photocatalytic conductive layer over a substrate;
   forming a reaction layer over the photocatalytic conductive layer;
   irradiating a surface of the photocatalytic conductive layer with ultraviolet light to form a region with conductivity and higher wettability than the reaction layer on the surface of the photocatalytic conductive layer; and
   forming a convex conductive layer by discharging a composition containing a liquid conductive particle into the region with high wettability, baking the discharged composition, and repetition of applying and baking the composition.

5. The method for manufacturing the semiconductor device according to claim 1, wherein the photocatalytic conductive layer is a layer having a photocatalytic property of which resistivity is lower than or equal to $1\times10^{-2}$ Ω cm.

6. The method for manufacturing the semiconductor device according to claim 1, wherein the photocatalytic conductive layer is formed of one selected from the group consisting of a film containing indium tin oxide, a film including a conductive material containing indium tin oxide mixed with silicon oxide, a fluorine-doped tin oxide film, an antimony-doped tin oxide film, a tin oxide film, a fluorine-doped zinc oxide film, an aluminum-doped zinc oxide film, a gallium-doped zinc oxide film, a boron-doped zinc oxide film, and a zinc oxide film.

7. The method for manufacturing the semiconductor device according to claim 1, wherein the reaction layer is formed using a composition containing a compound having an alkyl group or a composition containing organic silane.

8. The method for manufacturing the semiconductor device according to claim 2, wherein the photocatalytic conductive layer is a layer having a photocatalytic property of which resistivity is lower than or equal to $1\times10^{-2}$ Ω cm.

9. The method for manufacturing the semiconductor device according to claim 2, wherein the photocatalytic conductive layer is formed of one selected from the group consisting of a film containing indium tin oxide, a film including a conductive material containing indium tin oxide mixed with silicon oxide, a fluorine-doped tin oxide film, an antimony-doped tin oxide film, a tin oxide film, a fluorine-doped zinc oxide film, an aluminum-doped zinc oxide film, a gallium-doped zinc oxide film, a boron-doped zinc oxide film, and a zinc oxide film.

10. The method for manufacturing the semiconductor device according to claim 2, wherein the reaction layer is formed using a composition containing a compound having an alkyl group or a composition containing organic silane.

11. The method for manufacturing the semiconductor device according to claim 3, wherein the photocatalytic conductive layer is a layer having a photocatalytic property of which resistivity is lower than or equal to $1\times10^{-2}$ Ω cm.

12. The method for manufacturing the semiconductor device according to claim 3, wherein the photocatalytic conductive layer is formed of one selected from the group consisting of a film containing indium tin oxide, a film including a conductive material containing indium tin oxide mixed with silicon oxide, a fluorine-doped tin oxide film, an antimony-doped tin oxide film, a tin oxide film, a fluorine-doped zinc oxide film, an aluminum-doped zinc oxide film, a gallium-doped zinc oxide film, a boron-doped zinc oxide film, and a zinc oxide film.

13. The method for manufacturing the semiconductor device according to claim 3 wherein the reaction layer is formed using a composition containing a compound having an alkyl group or a composition containing organic silane.

14. The method for manufacturing the semiconductor device according to claim 4, wherein the photocatalytic conductive layer is a layer having a photocatalytic property of which resistivity is lower than or equal to $1\times10^{-2}$ $\Omega$ cm.

15. The method for manufacturing the semiconductor device according to claim 4, wherein the photocatalytic conductive layer is formed of one selected from the group consisting of a film containing indium tin oxide, a film including a conductive material containing indium tin oxide mixed with silicon oxide, a fluorine-doped tin oxide film, an antimony-doped tin oxide film, a tin oxide film, a fluorine-doped zinc oxide film, an aluminum-doped zinc oxide film, a gallium-doped zinc oxide film, a boron-doped zinc oxide film, and a zinc oxide film.

16. The method for manufacturing the semiconductor device according to claim 4, wherein the reaction layer is formed using a composition containing a compound having an alkyl group or a composition containing organic silane.

* * * * *